(12) United States Patent
Ravi et al.

(10) Patent No.: US 10,947,640 B1
(45) Date of Patent: *Mar. 16, 2021

(54) CVD REACTOR CHAMBER WITH RESISTIVE HEATING FOR SILICON CARBIDE DEPOSITION

(71) Applicant: Svagos Technik, Inc., Santa Clara, CA (US)

(72) Inventors: Tirunelveli S. Ravi, Saratoga, CA (US); Visweswaren Sivaramakrishnan, Cupertino, CA (US)

(73) Assignee: Svagos Technik, Inc., Santa Clara, CA (US)

( * ) Notice: Subject to any disclaimer, the term of this patent is extended or adjusted under 35 U.S.C. 154(b) by 120 days.

This patent is subject to a terminal disclaimer.

(21) Appl. No.: 15/831,139

(22) Filed: Dec. 4, 2017

Related U.S. Application Data

(60) Provisional application No. 62/429,674, filed on Dec. 2, 2016.

(51) Int. Cl.
*C30B 25/08* (2006.01)
*C30B 25/12* (2006.01)
(Continued)

(52) U.S. Cl.
CPC ............ *C30B 25/08* (2013.01); *C23C 16/455* (2013.01); *C23C 16/4586* (2013.01);
(Continued)

(58) Field of Classification Search
CPC ......... C30B 25/08; C30B 25/10; C30B 25/12; C23C 16/455; C23C 16/4586; C23C 16/4587
See application file for complete search history.

(56) References Cited

U.S. PATENT DOCUMENTS 5,314,570 A * 5/1994 Ikegaya .................. C23C 16/27
117/103
5,711,811 A * 1/1998 Suntola ..................... C23C 8/06
118/719

(Continued)

FOREIGN PATENT DOCUMENTS

JP         2014-72477 A1 *  4/2014  ........... C23C 16/325
WO  WO-2017040868 A1 *  3/2017  ....... H01L 21/68785

*Primary Examiner* — Jeffrie R Lund
(74) *Attorney, Agent, or Firm* — Pillsbury Winthrop Shaw Pittman LLP

(57) ABSTRACT

A CVD reactor for deposition of silicon carbide material on silicon carbide substrates, may comprise: an upper gas manifold and a lower gas manifold; and a substrate carrier comprising a gas tight rectangular box open on upper and lower surfaces, a multiplicity of planar walls across the width of the box, the walls being equally spaced in a row facing each other and defining a row of channels within the box, the walls comprising mounting fixtures for a plurality of substrates and at least one electrically resistive heater element; wherein the upper gas manifold and the lower gas manifold are configured to attach to the upper and lower surfaces of the substrate carrier, respectively, connect with upper and lower ends of the channels, and isolate gas flows in odd numbered channels from gas flows in even numbered channels, wherein the channels are numbered in order along the row; and wherein said electrically resistive heater elements and said mounting fixtures are coated with a material able to withstand exposure to (i) chemicals for removal of silicon carbide, such as $ClF_3$, and (ii) process temperatures up to 1700° C., examples of the material including tantalum carbide, diamond and boron nitride.

23 Claims, 22 Drawing Sheets

(51) Int. Cl.
   *C30B 25/10* (2006.01)
   *C23C 16/458* (2006.01)
   *C23C 16/455* (2006.01)

(52) U.S. Cl.
   CPC ......... *C23C 16/4587* (2013.01); *C30B 25/10* (2013.01); *C30B 25/12* (2013.01)

(56) References Cited

U.S. PATENT DOCUMENTS

| | | | | |
|---|---|---|---|---|
| 6,015,590 | A * | 1/2000 | Suntola | C23C 16/455 427/255.23 |
| 6,551,406 | B2 * | 4/2003 | Kilpi | C23C 16/45525 118/715 |
| 6,572,705 | B1 * | 6/2003 | Suntola | C23C 16/455 118/702 |
| 6,630,030 | B1 * | 10/2003 | Suntola | C23C 16/45523 118/728 |
| 6,835,416 | B2 * | 12/2004 | Kilpi | C23C 16/45525 427/248.1 |
| 7,060,132 | B2 * | 6/2006 | Lindfors | C23C 16/45502 117/102 |
| 7,498,059 | B2 * | 3/2009 | Suntola | C23C 16/455 427/255.28 |
| 7,798,096 | B2 * | 9/2010 | Mahajani | C23C 16/45508 118/723 E |
| 8,507,039 | B2 * | 8/2013 | Suntola | C23C 16/455 427/255.28 |
| 9,255,346 | B2 * | 2/2016 | Sivaramakrishnan | C30B 29/06 |
| 9,982,363 | B2 * | 5/2018 | Sivaramakrishnan | C30B 29/06 |
| 10,260,147 | B2 * | 4/2019 | Jouvray | C23C 16/4587 |
| 10,337,103 | B2 * | 7/2019 | Hyon | C23C 16/45504 |
| 2005/0129580 | A1 * | 6/2005 | Swinehart | B01F 5/0475 422/400 |
| 2006/0081187 | A1 * | 4/2006 | Maccalli | C23C 16/46 118/725 |
| 2006/0275104 | A1 * | 12/2006 | Speciale | C30B 25/12 414/787 |
| 2008/0152803 | A1 * | 6/2008 | Lamouroux | C23C 16/045 427/248.1 |
| 2009/0283029 | A1 * | 11/2009 | Arena | C23C 16/4412 117/108 |
| 2010/0092697 | A1 * | 4/2010 | Poppe | C23C 16/45502 427/585 |
| 2011/0174217 | A1 * | 7/2011 | Gersdorff | C23C 16/042 118/500 |
| 2013/0032084 | A1 * | 2/2013 | Sivaramakrishnan | C30B 29/06 117/102 |
| 2013/0104802 | A1 * | 5/2013 | Arena | C23C 16/45593 118/722 |
| 2014/0165910 | A1 * | 6/2014 | Shin | C23C 16/45546 118/719 |
| 2014/0318442 | A1 * | 10/2014 | Sivaramakrishnan | C30B 25/105 117/102 |
| 2015/0122178 | A1 * | 5/2015 | Vadadi | C23C 16/45504 118/723 R |
| 2015/0206785 | A1 * | 7/2015 | Miyashita | C23C 16/4585 117/88 |
| 2015/0361555 | A1 * | 12/2015 | Sivaramakrishnan | C23C 16/46 427/255.28 |
| 2017/0037514 | A1 * | 2/2017 | Sivaramakrishnan | C23C 16/46 |
| 2018/0119278 | A1 * | 5/2018 | Kornmeyer | H01L 21/67313 |

* cited by examiner

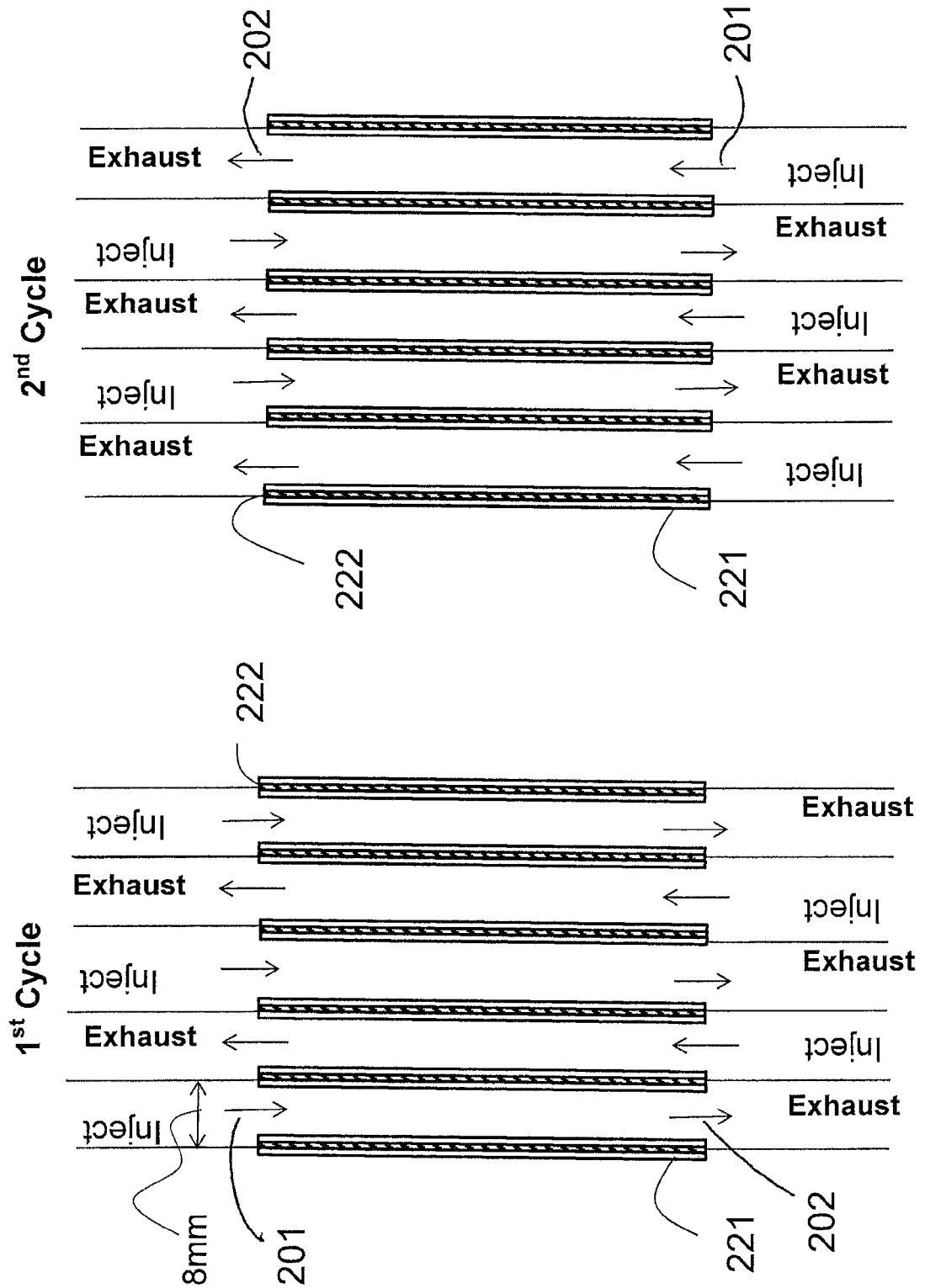

SECTION X-X

CVD REACTOR CHAMBER WITH RESISTIVE HEATING FOR SILICON CARBIDE DEPOSITION

RELATED APPLICATIONS

This application claims the benefit of U.S. Provisional Patent Application Ser. No. 62/429,674 filed Dec. 2, 2016, and is hereby incorporated by reference.

FIELD OF THE INVENTION

The present invention relates generally to CVD (chemical vapor deposition) epitaxial reactors with resistive heating.

BACKGROUND

There is a need for tools and methods for efficient and low cost chemical vapor deposition (CVD) of thin and thick films of silicon carbide for semiconductor devices.

SUMMARY OF THE INVENTION

According to some embodiments, a CVD reactor for single sided deposition of silicon carbide material on silicon carbide substrates, may comprise: a vacuum chamber; an upper gas manifold and a lower gas manifold within the vacuum chamber; and a substrate carrier comprising a gas tight rectangular box open on upper and lower surfaces, the gas tight box comprising a first multiplicity of planar walls across the width of the box, the walls being equally spaced in a row facing each other and defining a row of channels within the box, the walls comprising mounting fixtures for a plurality of substrates, the walls comprising at least one electrically resistive heater element; wherein the upper gas manifold and the lower gas manifold are configured to attach to the upper and lower surfaces of the substrate carrier, respectively, the upper gas manifold and the lower gas manifold connecting with upper and lower ends of the channels, the upper gas manifold and the lower gas manifold being configured to isolate gas flows in odd numbered channels from gas flows in even numbered channels, wherein the channels are numbered in order along the row, wherein the gas flows through the channels are from one of the upper gas manifold and the lower gas manifold to the other of the upper gas manifold and the lower gas manifold, wherein the upper gas manifold and the lower gas manifold are configured to allow gas flows in odd numbered channels to be in opposite directions to gas flows in even numbered channels, and wherein said electrically resistive heater elements and said mounting fixtures are coated with a material able to withstand exposure to (i) chemicals for removal of silicon carbide, such as $ClF_3$, and (ii) process temperatures up to 1700° C., examples of the material including tantalum carbide, diamond and boron nitride.

According to some embodiments, a CVD reactor for deposition of silicon carbide material on silicon carbide substrates, may comprise: a vacuum chamber; an upper gas manifold and a lower gas manifold within the vacuum chamber; and a substrate carrier comprising: (1) a gas tight rectangular box open on upper and lower surfaces, the gas tight box comprising a multiplicity of planar walls across the width of the box, the walls being equally spaced in a row facing each other and defining a row of channels within the box, the walls comprising at least one electrically resistive heater element, and (2) substrate holders configured to fit within the channels, the substrate holders being configured to allow gas flow over both surfaces of substrates when mounted in the substrate holder, wherein the upper gas manifold and the lower gas manifold are configured to attach to the upper and lower surfaces of the substrate carrier, respectively, the upper gas manifold and the lower gas manifold connecting with upper and lower ends of the channels, the upper gas manifold and the lower gas manifold being configured to isolate gas flows in odd numbered channels from gas flows in even numbered channels, wherein the channels are numbered in order along the row, wherein the gas flows through the channels are from one of the upper gas manifold and the lower gas manifold to the other of the upper gas manifold and the lower gas manifold, wherein the upper gas manifold and the lower gas manifold are configured to allow gas flows in odd numbered channels to be in opposite directions to gas flows in even numbered channels, and wherein said electrically resistive heater elements and said substrate holders are coated with a material able to withstand exposure to (i) chemicals for removal of silicon carbide, such as $ClF_3$, and (ii) process temperatures up to 1700° C., examples of the material including tantalum carbide, diamond and boron nitride.

According to some embodiments, a method of operating a CVD reactor of the present invention as described above, may comprise: mounting silicon carbide substrates in the substrate carrier; loading the substrate carrier into the vacuum chamber and mating the substrate carrier with the upper gas manifold and the lower gas manifold; providing and maintaining a vacuum environment within the vacuum chamber; making electrical contact to the at least one electrically resistive heater; heating the substrates to a deposition temperature by flowing current through the at least one electrically resistive heater; and while heating the substrates, flowing process gas through odd numbered channels from the upper gas manifold to the lower gas manifold, and simultaneously flowing process gas through even numbered channels from the lower gas manifold to the upper gas manifold.

According to some embodiments, a substrate carrier for a CVD reactor may comprise: a gas tight rectangular box open on upper and lower surfaces, the gas tight box comprising a first multiplicity of planar walls across the width of the box, the walls being equally spaced in a row facing each other and defining a row of channels within the box, the walls comprising mounting fixtures for a plurality of substrates, the walls comprising a second multiplicity of electrically resistive heater elements; wherein each of the second multiplicity of electrically resistive heater elements are arranged in parallel stripes roughly perpendicular to a direction through the channels from the open upper surface to the open lower surface, and wherein said electrically resistive heater elements and said mounting fixtures are coated with a material able to withstand exposure to (i) chemicals for removal of SiC, such as $ClF_3$, and (ii) process temperatures up to 1700° C., examples of the material including tantalum carbide, diamond and boron nitride.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 3A & 3B show cross-sectional views of a representation of a second embodiment of a substrate carrier also showing the separation of gas flows between even and odd channels within the substrate carrier, according to some embodiments of the present invention;

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
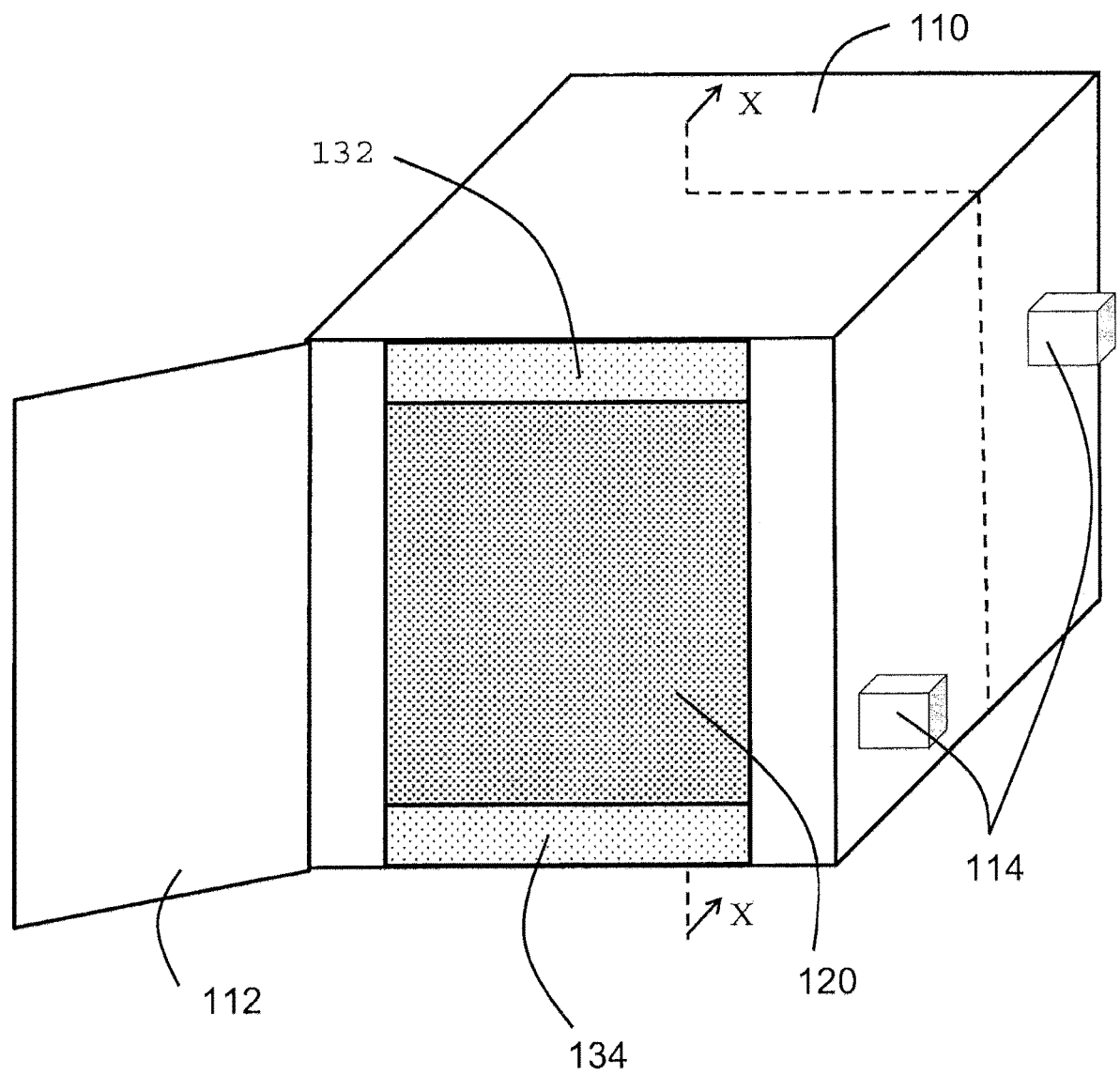
FIG. 1 is a perspective view of a representation of a CVD epitaxial reactor, according to embodiments of the present invention.

FIG. 1 shows a perspective view of a CVD reactor chamber 110 with door 112 according to some embodiments of the present invention. Upper and lower gas manifolds, 132 and 134 respectively, are shown, with a space 120 between the manifolds for insertion of a substrate carrier. Electrical connectors 114, used for making electrical contact to electrically resistive heater elements, are also shown; the number and location of these connectors will depend on the configuration and number of electrically resistive heater elements used in the substrate carrier. In some embodiments, the electrical connectors may be clamping electrical connectors as described herein.

Figure 2A:
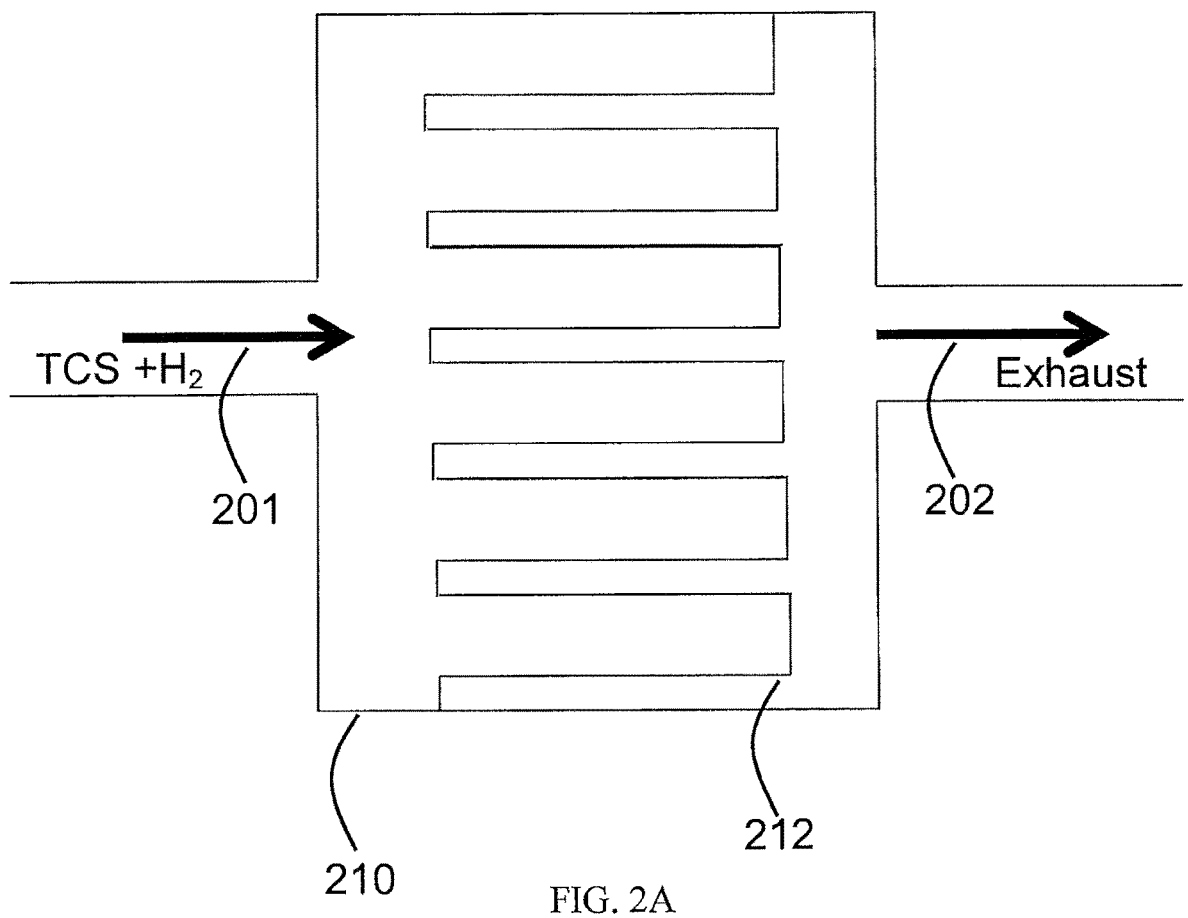
FIGS. 2A & 2B show top down and cross-sectional views, respectively, of a representation of a first embodiment of a substrate carrier also showing the separation of gas flows between even and odd channels within the substrate carrier, according to some embodiments of the present invention.
Figure 2B:
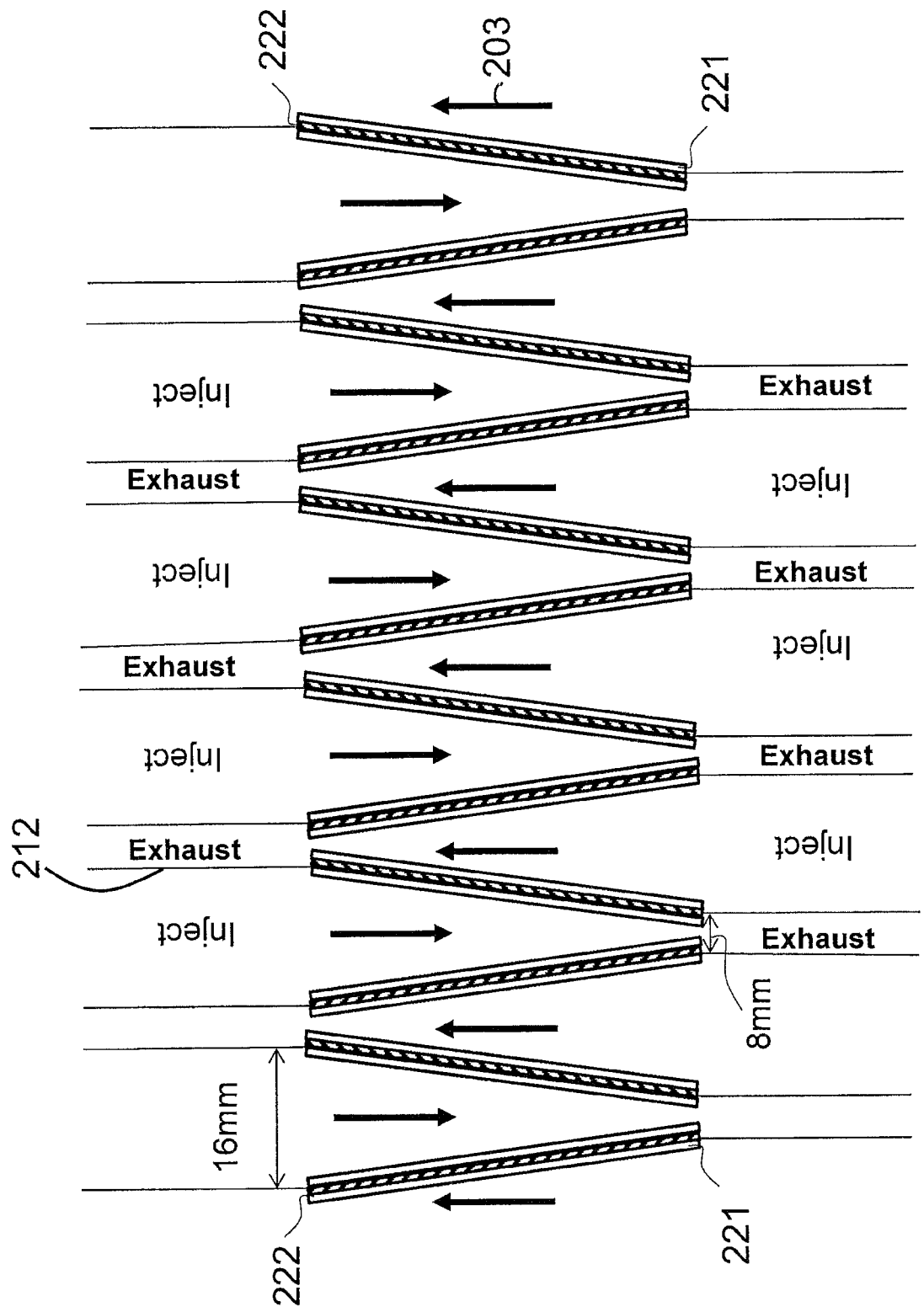

FIGS. 2A & 2B show top down and cross-sectional views of a representation of a first embodiment of a substrate carrier 210 also showing the separation of gas flows between even and odd channels within the substrate carrier. It is important to note that the gas flow direction 203 is opposite for immediately adjacent channels—gas flow is "up" (from gas inject to gas exhaust) in odd channels and "down" in even channels in FIG. 2B; this process gas "counterflow" is important for maintaining a sufficiently uniform substrate surface temperature during deposition on the substrate surfaces exposed to the process gas. The walls separating adjacent channels are formed of electrically resistive heaters 222 which directly heat the substrates 221. Counterflow results in heating of the injected process gas 201 by the exhaust gas 202 through the walls 212 of the runway—see for example FIG. 4B. The channel width and angles of substrates are merely examples—actual channel width and substrate angles can be optimized for particular depositions. Note that holding the substrates at an angle to the process gas flow is done to compensate for depletion of reactants in the process gas along the direction of process gas flow across the substrate surfaces. In embodiments, the angel of the substrates to the direction of process gas flow through the channel may be between 3 and 6 degrees.

FIGS. 3A & 3B show cross-sectional views of a representation of a second embodiment of a substrate carrier also showing the separation of gas flows between even and odd channels within the substrate carrier. Due to the substrates being mounted parallel to the gas flow direction there may be some effects on the deposition uniformity due to depletion; to compensate for the effects of depletion the direction of gas flow is reversed part way through film deposition—this is represented by the "1 cycle" and "2° cycle" of FIGS. 3A and 3B, respectively. Flow switching requires further complexity in the gas manifold design, as discussed below.

Figure 4A:
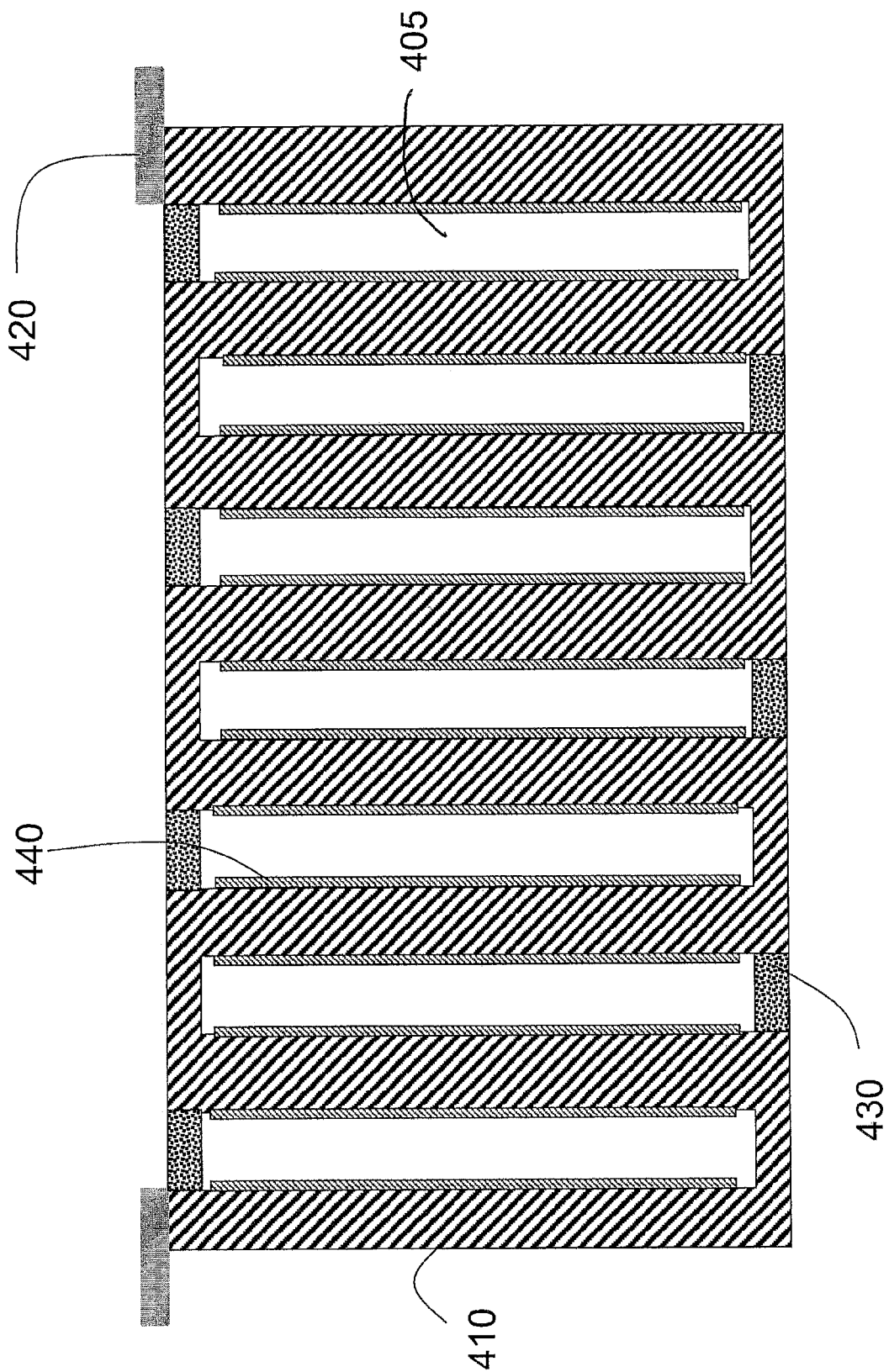
FIGS. 4A & 4B show cross-sections of an embodiment of a substrate carrier in horizontal and vertical planes, respectively, according to some embodiments of the present invention.
Figure 4B:
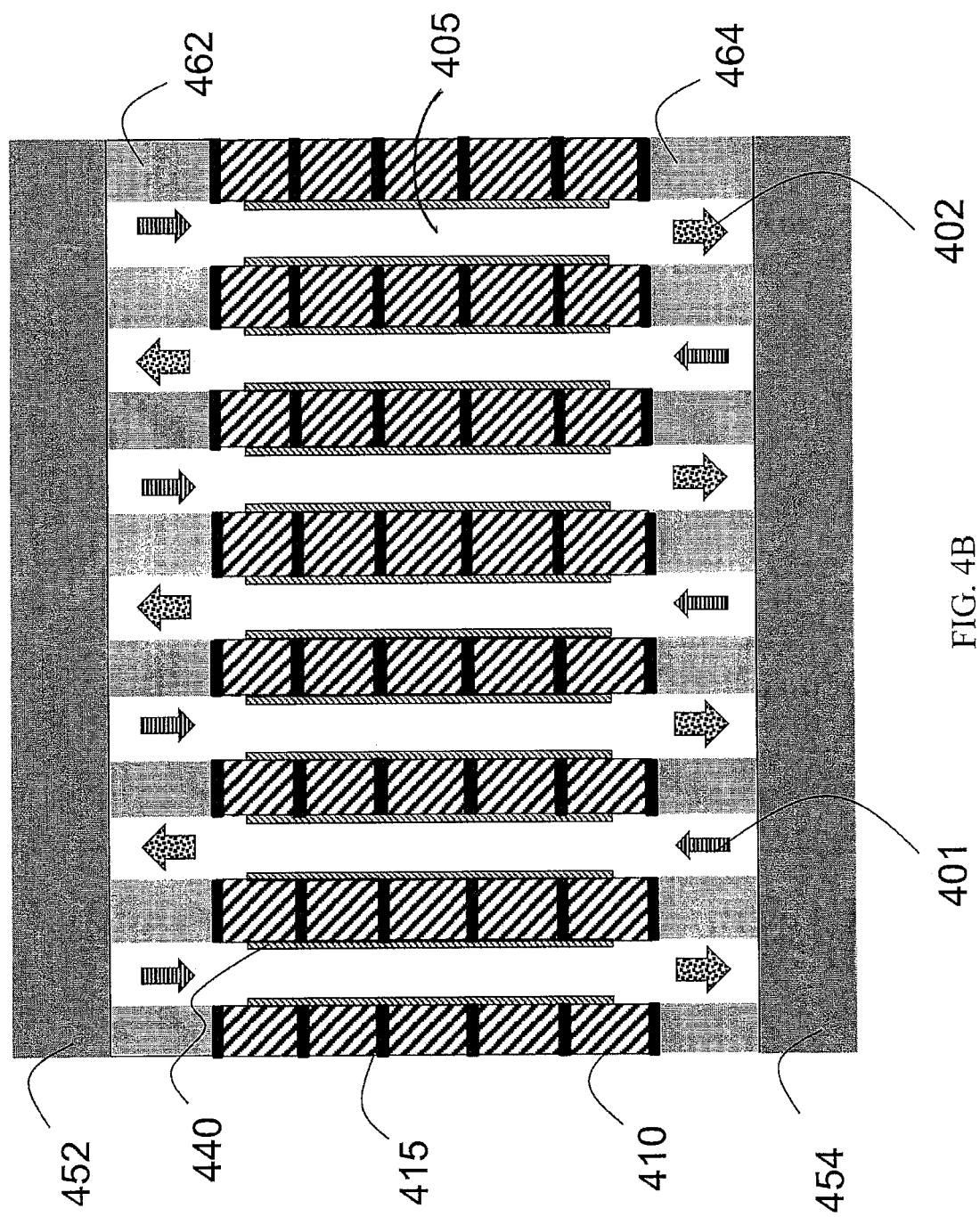

FIGS. 4A & 4B show cross-sections of an embodiment of a substrate carrier in horizontal and vertical planes, respectively. The electrically resistive heater elements 410 are seen to have a serpentine shape in the horizontal plane, allowing for one element to service multiple channels 405. As an example, the electrically resistive heating elements may be made of graphite CVD coated with TaC, although it is expected that in some embodiments graphite covered in boron nitride or graphite covered in diamond or graphite covered in aluminum nitride might be utilized. (The coating on the graphite needs to be able to withstand the selective removal of any deposited silicon carbide on the coating, for example using $ClF_3$ chemistry; furthermore, the coating needs to withstand processing temperatures suitable for silicon carbide deposition, for example up to 1700° C.) Electrical contacts 420 at the ends of the element allow for interconnection of multiple elements in either series or parallel and also allow for electrical connection to a power supply (AC or DC)—for example by using clamps, as described herein. The electrically insulating ribs 430 are used to complete the channels—keeping the gas within the substrate carrier. Substrates 440 are mounted to the heating elements within each channel. The electrically insulating ribs may be made of quartz, graphite covered in boron nitride, graphite covered in aluminum nitride, or quartz covered in silicon carbide, for example. FIG. 4B shows how multiple resistive elements 410 may be stacked together and separated by electrical insulators 415, thus allowing for independent control of each element if needed to maintain a uniform temperature over the substrate surfaces. Upper and lower runways, 462 and 464, respectively, which sit between the upper and lower gas manifolds, 452 and 454, respectively, and the resistive elements 410, allow for heat exchange between gases in adjacent channels—injected gases 401 and exhaust gases 402—as discussed above. The runways may be made of, for example, graphite CVD coated with tantalum carbide, graphite covered in boron nitride or graphite covered in aluminum nitride—generally it is desirable to use the same material as used for the resistive heater elements, since it is desirable to be able to remove any silicon carbide deposited on the interior surfaces of the runways, and the same high temperature tolerance is desirable. Furthermore, the thickness of the resistive elements 410 may be varied as needed to create regions which generate more or less heat (due to greater or lesser resistance, respectively).

Furthermore, FIG. 4B shows an example of an electrically resistive heater structure comprising 5 electrically resistive heating elements 410 which may correspond to 5 heating zones, where the heat generated from each element can be controlled separately by controlling the current passing through each element. The concept of different heating zones is discussed in more detail in Pat. Appl. Publ. Nos. US 2010/0215872, US 2010/0263587 and US 2013/0032084, all incorporated by reference herein in their entirety. Note that along the gas flow direction a single substrate is shown attached to the resistive elements—in some embodiments the single substrate is preferred, although other embodiments may have multiple substrates attached to the resistive elements along the direction of gas flow. (Single substrates may be 166 mm×166 mm silicon carbide substrates, 2" wafers, 4" wafers, 6" wafers, 8" wafers, etc.) The number of channels 405 in a substrate carrier will typically be greater than 6 and will vary from application to application; for example, in embodiments (suitable for high throughput applications) there are between about 40 and about 60 channels, in some embodiments between about 10 and about 40, and further embodiments (suitable perhaps for lower throughput processing of specialty substrates) between about 6 and about 10 channels.

Figure 5:
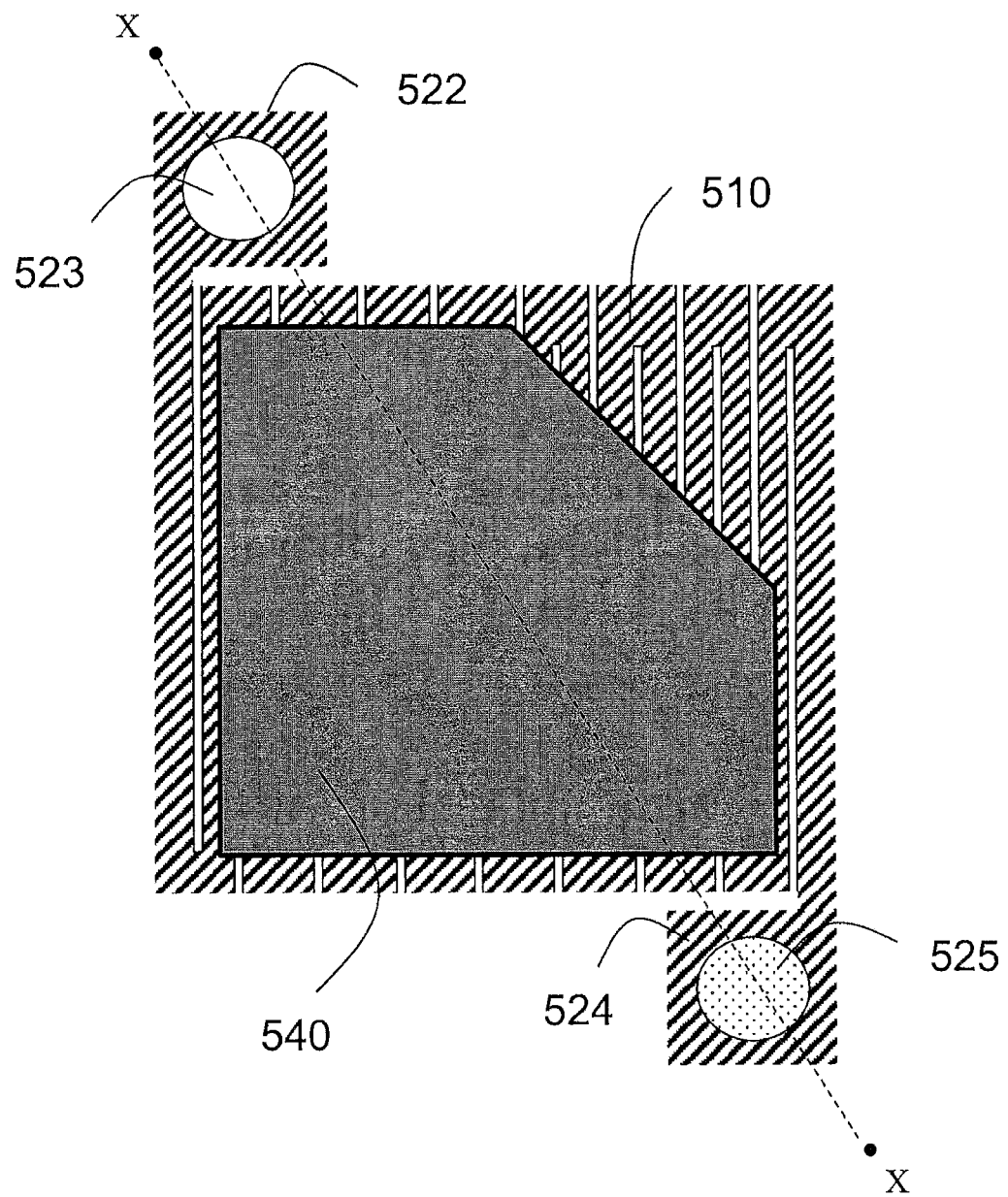
FIG. 5 shows a different embodiment of the electrically resistive heater, where the wall between adjacent channels may be formed from a single heating element, which is shown to have a serpentine configuration, according to some embodiments of the present invention.

FIG. 5 shows a different embodiment of the electrically resistive heater—the wall between adjacent channels may be formed from a single electrically resistive heating element 510, which is shown to have a serpentine configuration. The substrate 540 is shown in a mounting position, and is partially cut-away to show the details of the serpentine configuration of the element. The heating element 510 has an upper connector flange 522 with a through hole 523 and a lower connector flange 524 with a blind hole 525—these flanges may be used to connect together multiple heating elements as described below.

Figure 6:
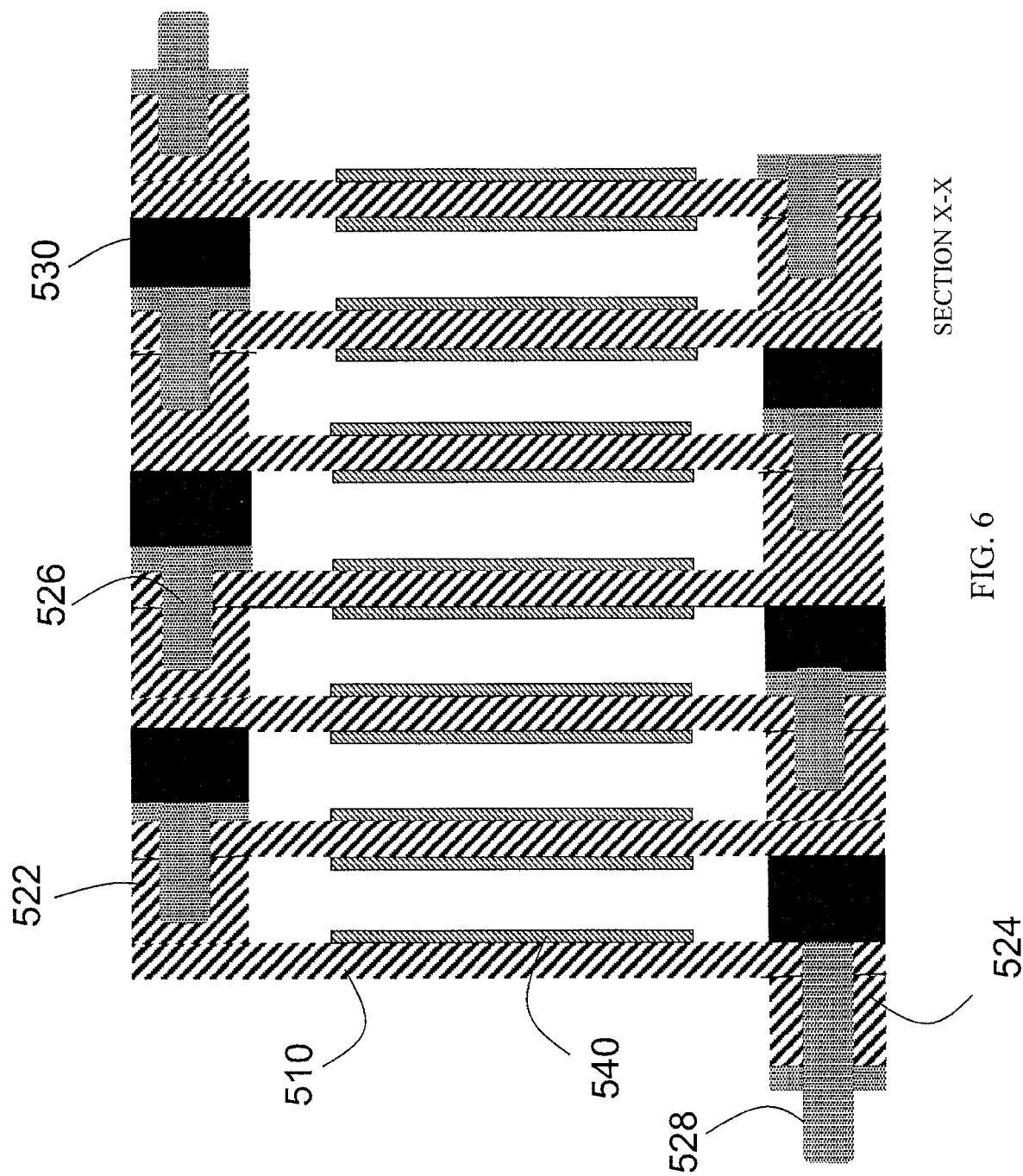
FIGS. 6 & 7 are cross-sectional views which provide examples of how the heating elements of FIG. 5 may be combined to form a substrate carrier, according to some embodiments of the present invention.
Figure 7:
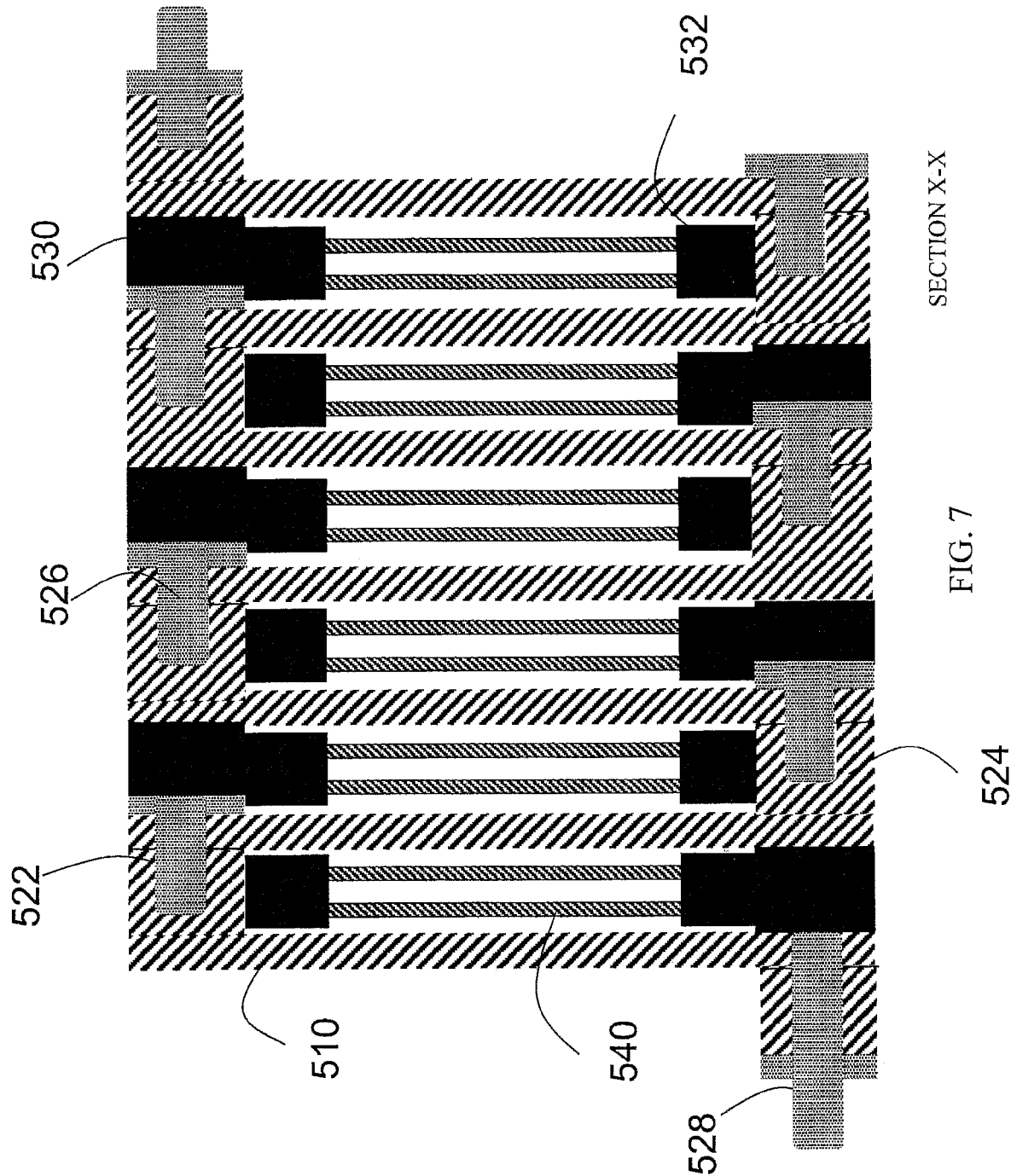

FIGS. 6 & 7 are cross-sectional views which provide examples of how heating elements of FIG. 5 may be combined to form a substrate carrier. Electrically conductive connectors 526, electrically insulating standoffs 530 and power connectors 528 are used to combine the heating elements 510 in series in the examples provided. Note that FIG. 7 shows a wafer holder specifically for double-sided deposition on substrates—here 2 substrates 540 are shown per channel, although it may be possible to include more than 2 substrates per channel providing uniform substrate temperature can be maintained for all substrates during deposition. The substrates 540 are shown held in electrically insulating substrate holders 532 within each channel. Furthermore, substrates could also be mounted on the heating elements 510 and undergo single-sided deposition while double-sided deposition is being done.

Figure 8A:
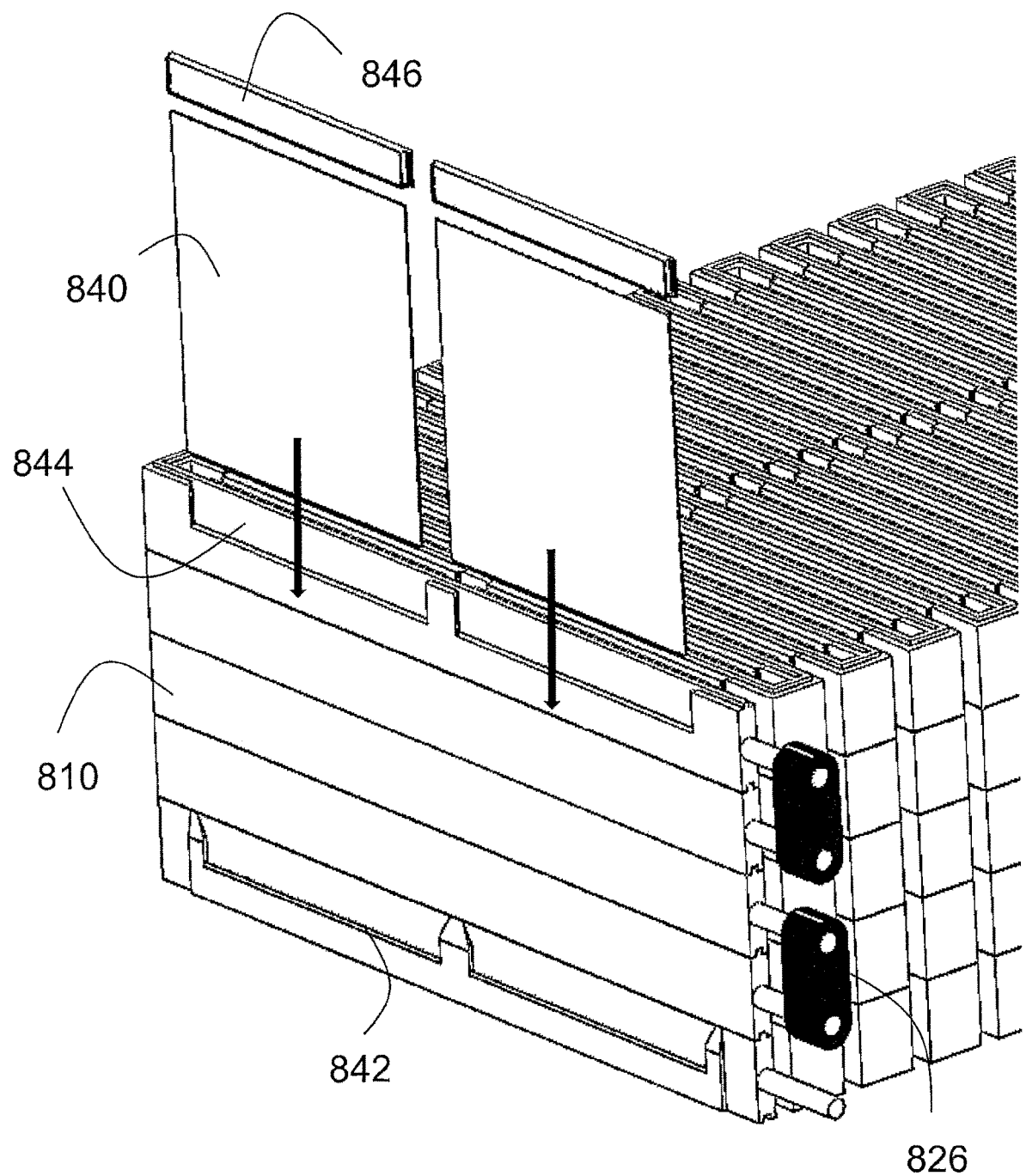
FIGS. 8A, 8B & 8C are perspective views showing more details of a substrate carrier, according to some embodiments of the present invention.
Figure 8B:
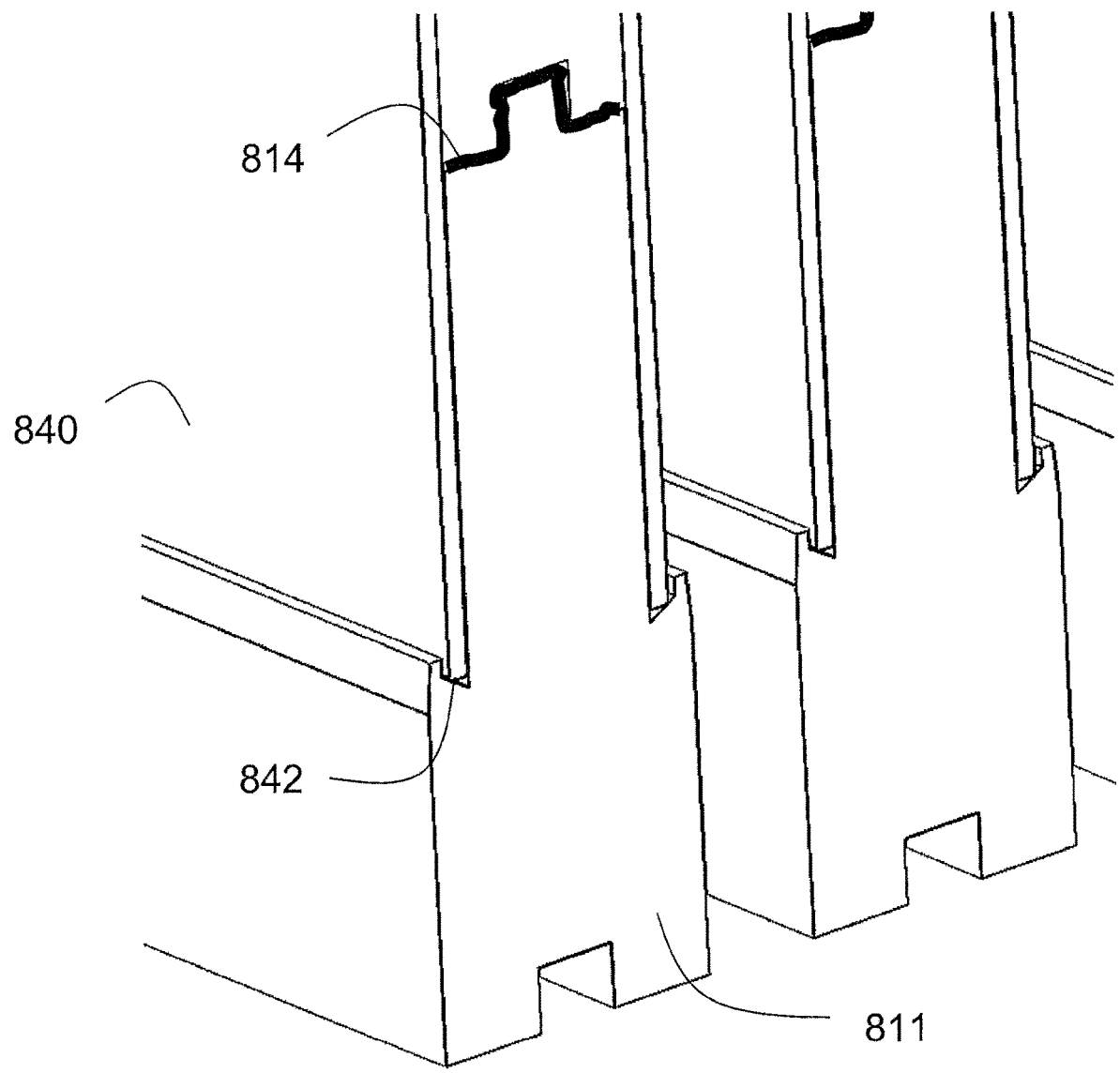
Figure 8C:
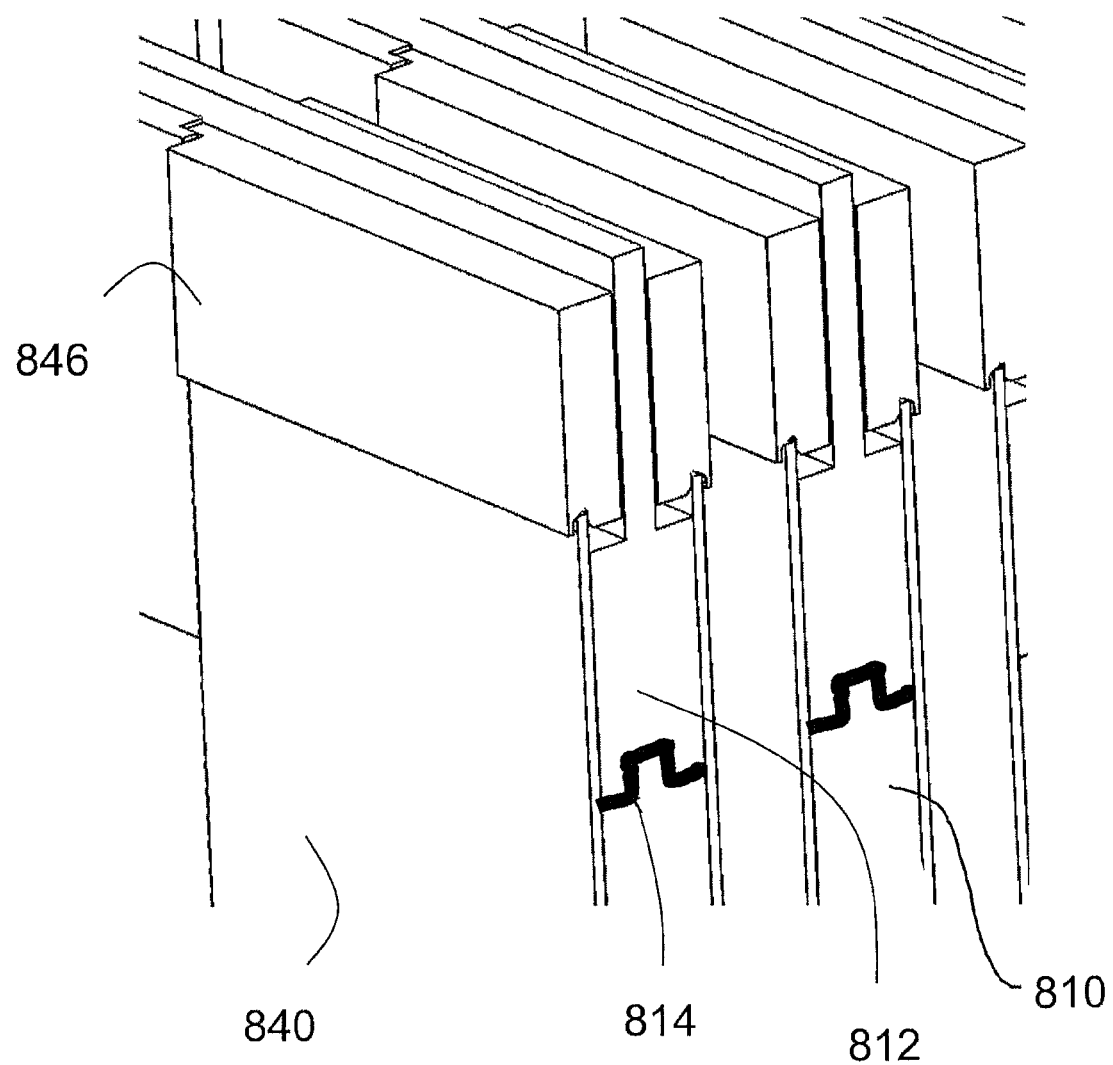

FIGS. 8A, 8B & 8C are perspective views showing more details of a substrate carrier, particularly one example of substrate mounting. Two substrates 840 are shown in FIG. 8A being dropped into place in receiving channels 842 followed by dropping clamps 846 in position in clamp receiving slots 844 to secure the substrates in place. The sectional views of FIGS. 8B & 8C show further details of how the substrates 840 fit into the receiving channels 842 and how the clamp 846 fits into the clamp receiving slot 844 and secures the substrate in place. Note that the receiving channels and clamp receiving slots may be formed in electrically resistive elements 811 and 812, respectively. Further note the example of series connectors 826 for electrically connecting in series the heating elements 810, according to some embodiments, and the electrically insulating layer 814 between elements. Furthermore, to better accommodate electrically conductive substrates, and avoid shorting heating elements, in embodiments an electrically insulating plate may be placed between the substrate and the heating elements—for example, an insulating plate could be placed between a silicon carbide substrate and the heating elements. (Such a plate may also have the benefit of improving heat diffusion and thus temperature uniformity of the substrate.) Note also that the ridges at the top and bottom of heating elements may be varied form those shown in the figures, and that other configurations of insulators (other than insulator 814) may be used between the elements—for example, an insulating rod may be used to electrically isolate the elements and the elements may have v-shaped notches to accommodate the rods.

Figure 9:
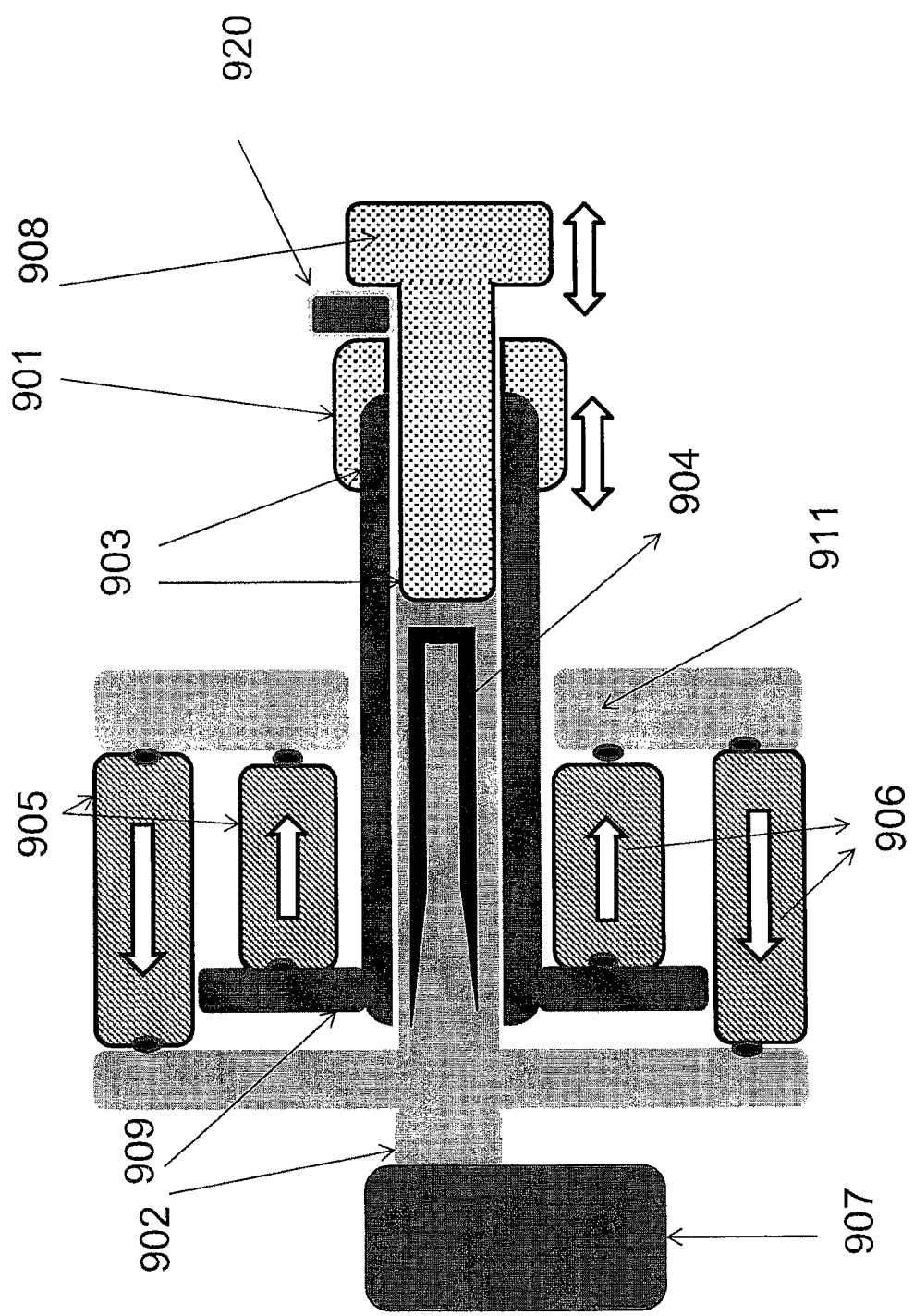
FIGS. 9 & 10 show representations of different examples of make-and-break clamps that may be used to provide electrical power to the electrically resistive heating elements, according to some embodiments of the present invention.
Figure 10:
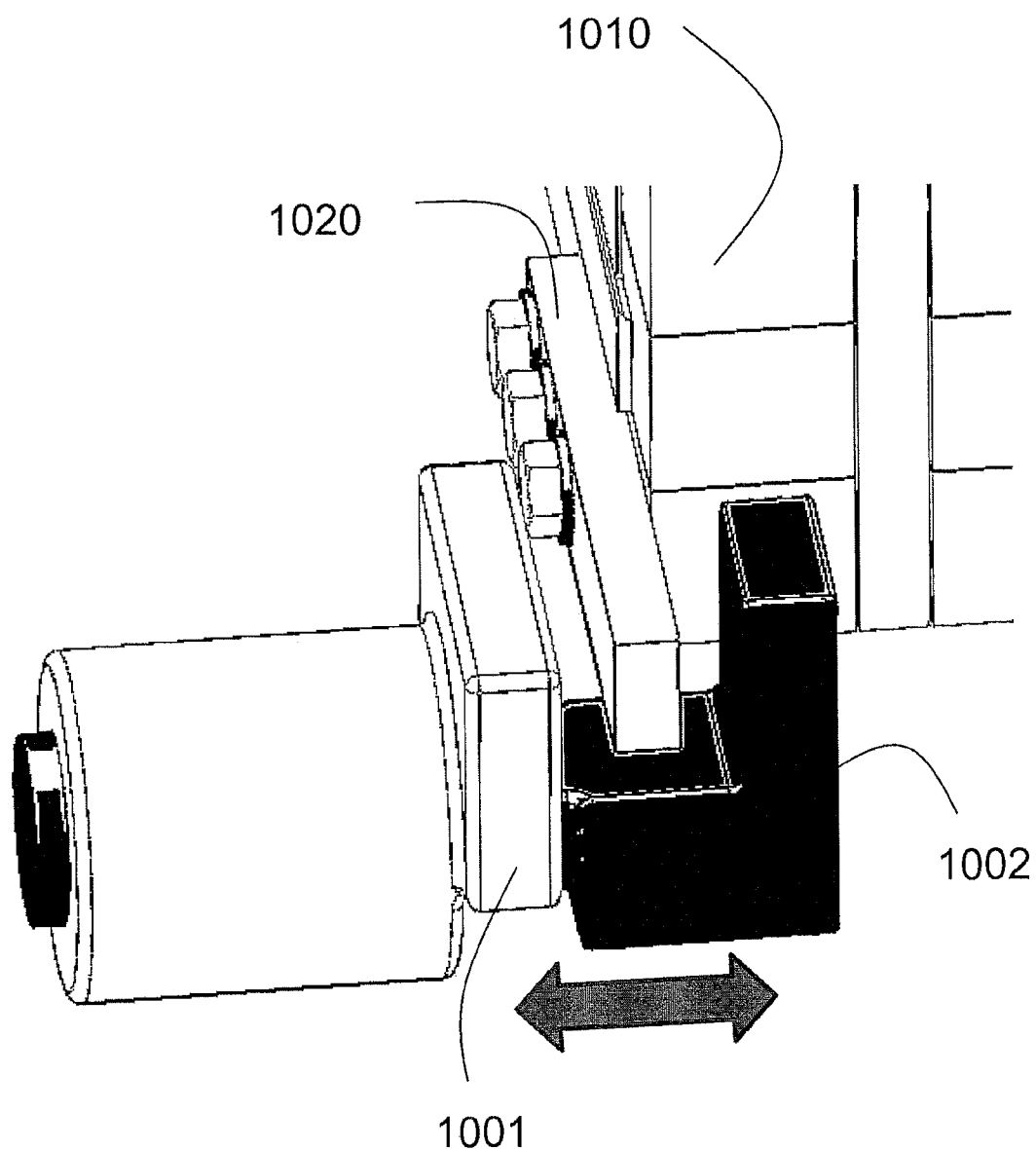

FIGS. 9 & 10 show examples of make-and-break clamps that may be used in some embodiments to provide electrical power to the electrically resistive heating elements. FIG. 9 shows a schematic representation of the clamp, showing the vacuum feedthrough and the mechanism for moving the clamp. A contact 920 from the heater assembly is shown being clamped between circular plate clamps 901 and 908—direction of motion of the plate clamps is shown by the arrows. The contact and plate clamps may be TaC coated graphite, for example. A piston comprises components 902 and 909 (formed of Pt plated Cu/Ni, for example) which are moved relative to each other by electrically isolated, pneumatically driven (in directions 906), bellows 905. The bellows being connected to the vacuum chamber wall 911. Component 902 is connected at one end to a power connection 907, and at the other to the plate clamp 908. The component 902 may be water cooled by cooling circuit 904. The components 902 and 909 may have threaded connections 903 to the plate clamps 908 and 901, respectively.

FIG. 10 shows a perspective view of the end part of a clamp positioned to clamp onto a tongue 1020 which is connected to an electrically resistive heating element of a substrate carrier 1010. Clamp plates 1001 and 1002 may be moved relative to each other in the directions shown by the arrow to either clamp or release the tongue 1020.

Figure 11A:
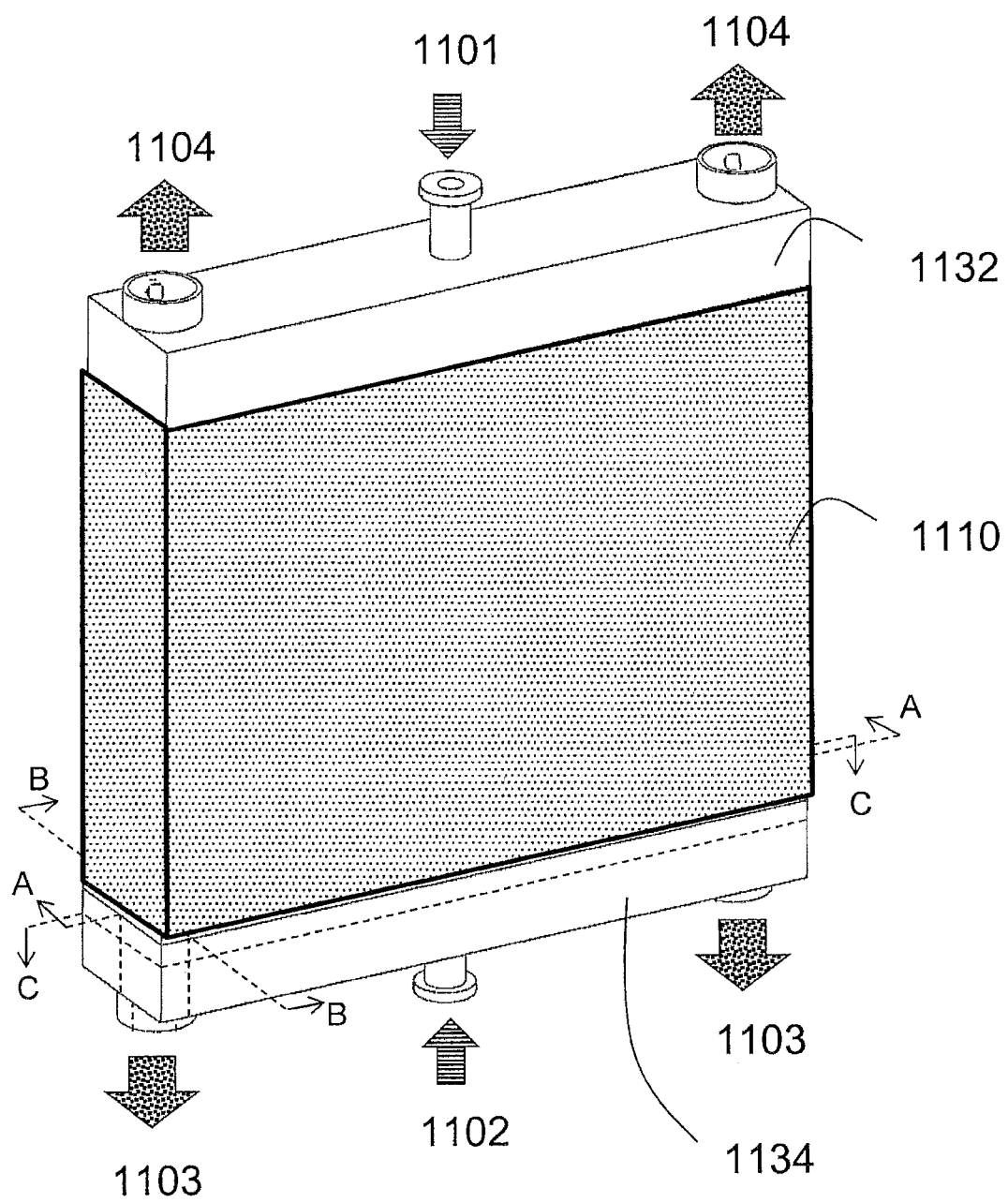
FIGS. 11A-11D show views of an example of a gas manifold suitable for use with a substrate carrier such as shown in FIG. 2B, which manifolds can accommodate gas counterflow, according to some embodiments of the present invention.
Figure 11B:
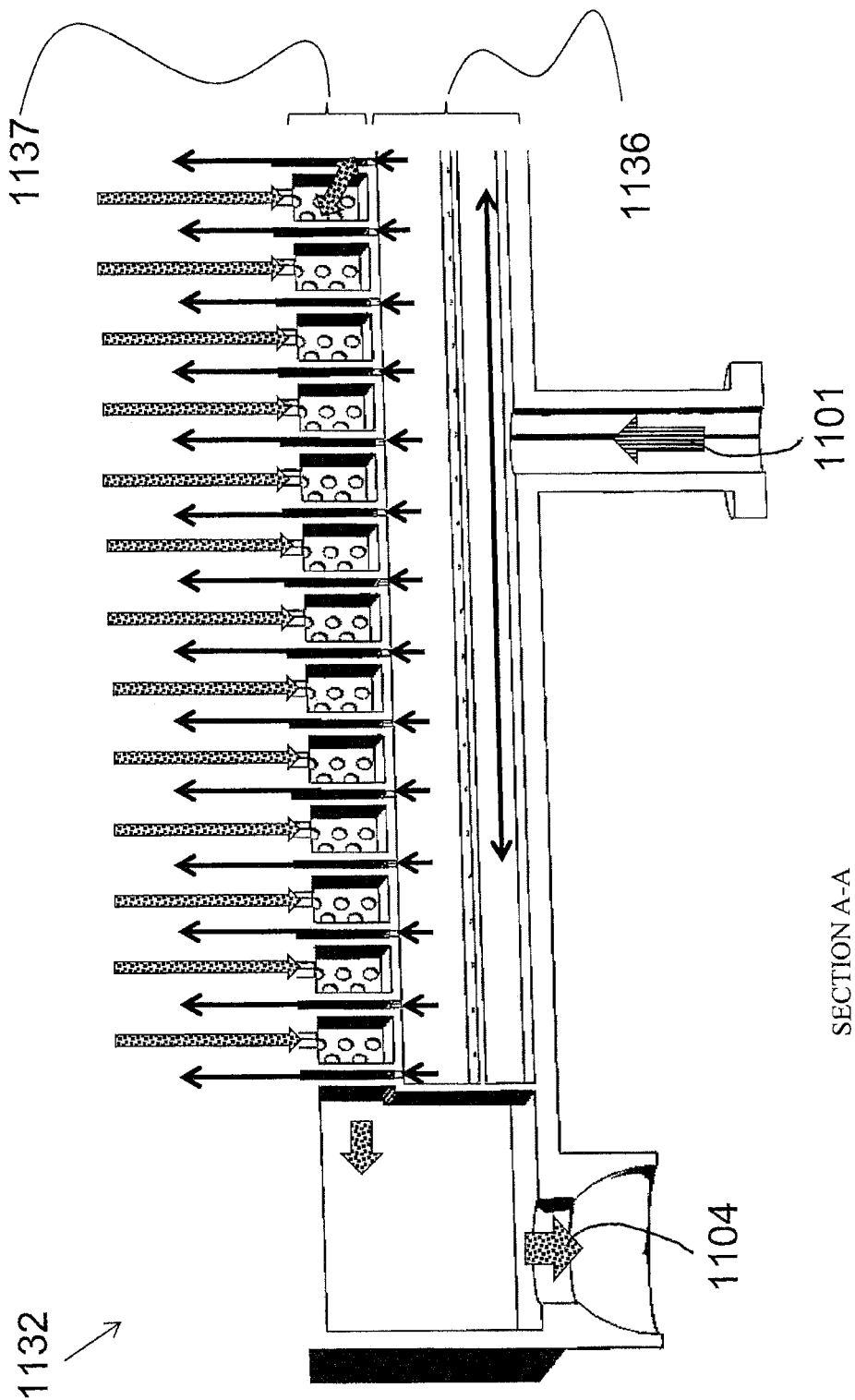
Figure 11C:
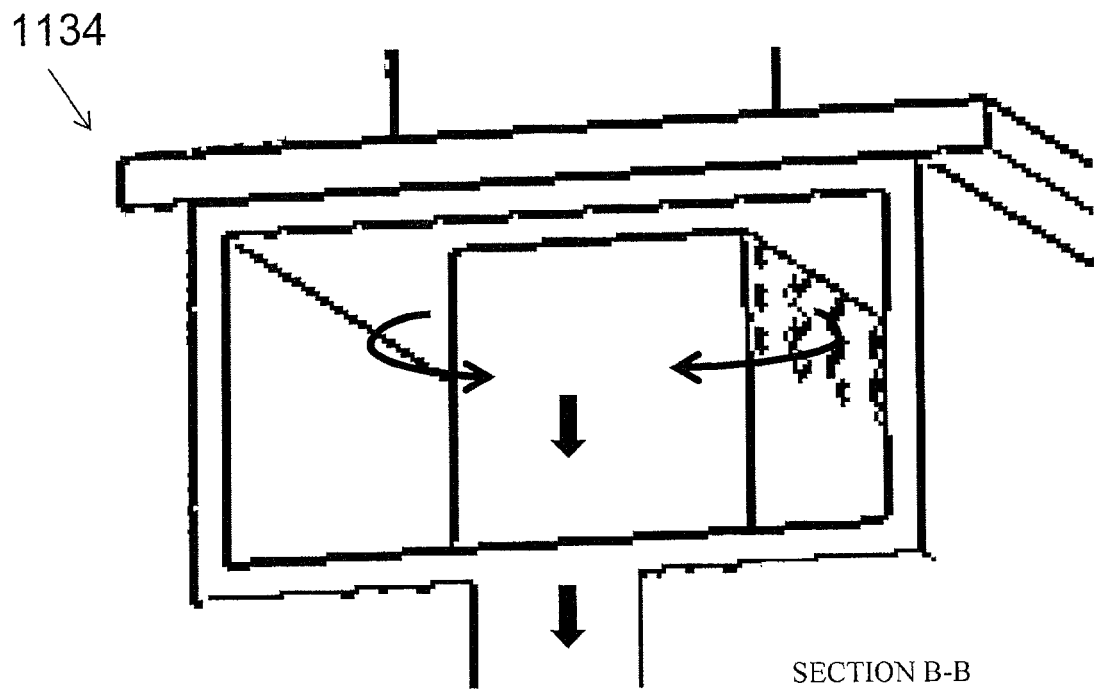
Figure 11D:
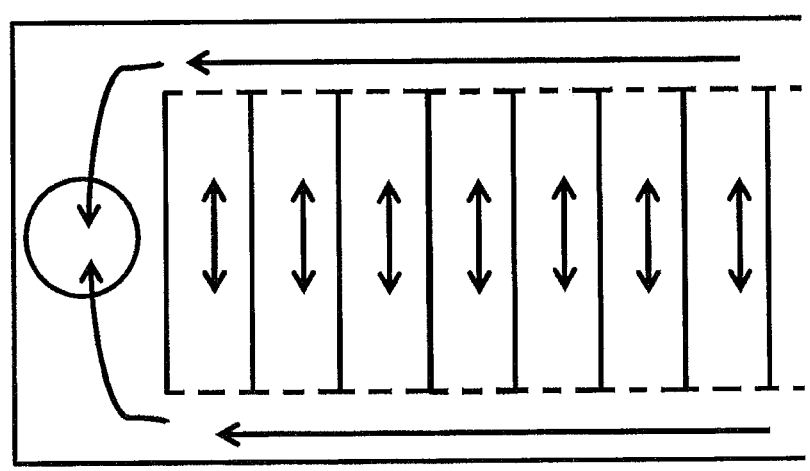

FIGS. 11A through 11D show views of an example of a gas manifold suitable for use with a substrate carrier such as shown in FIG. 2B, which manifolds can accommodate the counterflow. Note that in embodiments the manifolds and substrate carrier may have greater depth to accommodate large substrates, such as substrates in the range of 140 to 170 mm on a side. FIG. 11A is a perspective view of both upper and lower gas manifolds 1132 and 1134, respectively, attached to a substrate carrier 1110. The following gas flows are identified: process gas in (odd slots) 1101, process gas in (even slots) 1102, exhaust gas out (odd slots) 1103, and exhaust gas out (even slots) 1104. FIG. 11B is a perspective view of a gas manifold 1132 cut along A-A, showing a process gas tier 1136 for flowing process gas 1101 into the substrate carrier, and an exhaust gas tier 1137 for flowing exhaust gas 1104 out of the substrate carrier. FIG. 11C is a perspective view of a gas manifold 1134 cut along B-B, showing exhaust gas flow. FIG. 11D is a cross-sectional view of plane C-C showing flow of exhaust gas through the exhaust gas tier 1137.

Figure 12A:
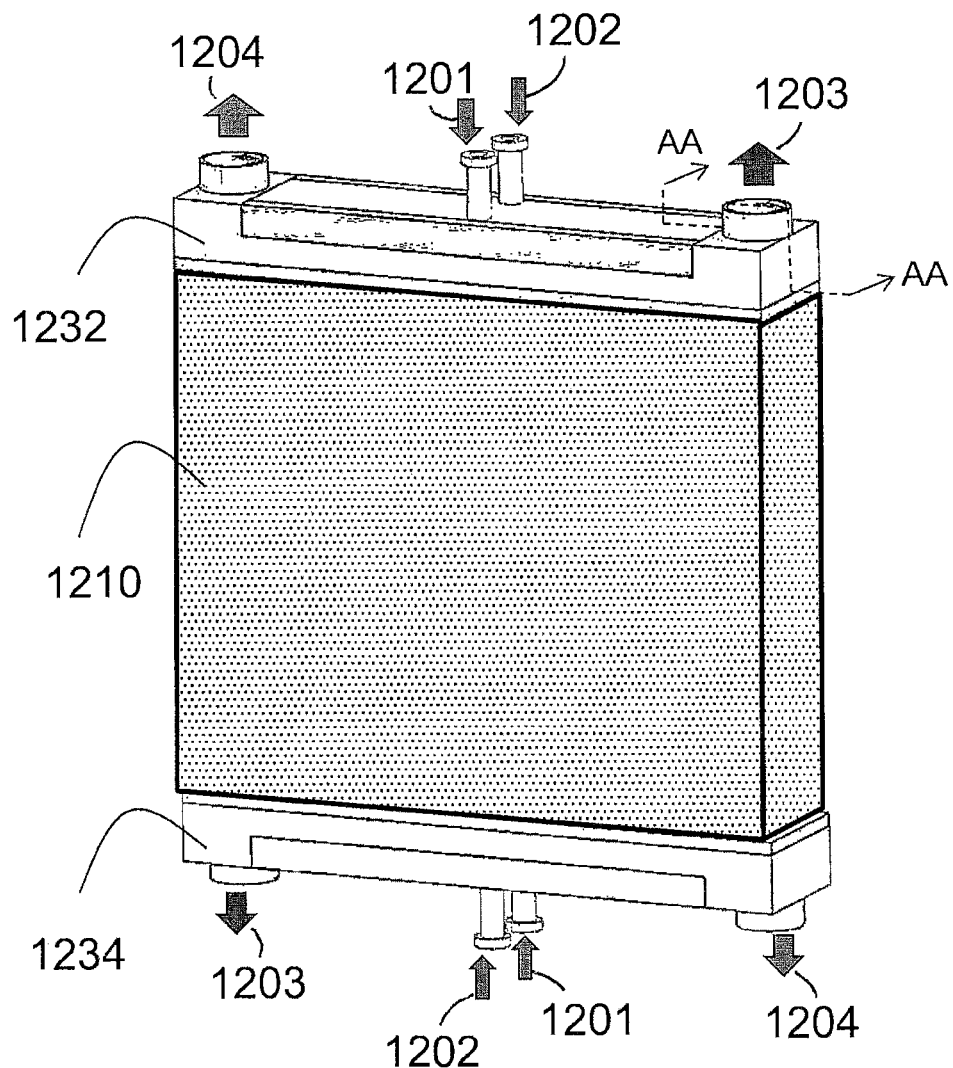
FIGS. 12A through 12D show views of an example of a gas manifold suitable for use with a substrate carrier such as shown in FIGS. 3A & 3B, which manifolds can accommodate gas counterflow and also flow switching, according to some embodiments of the present invention.
Figure 12B:
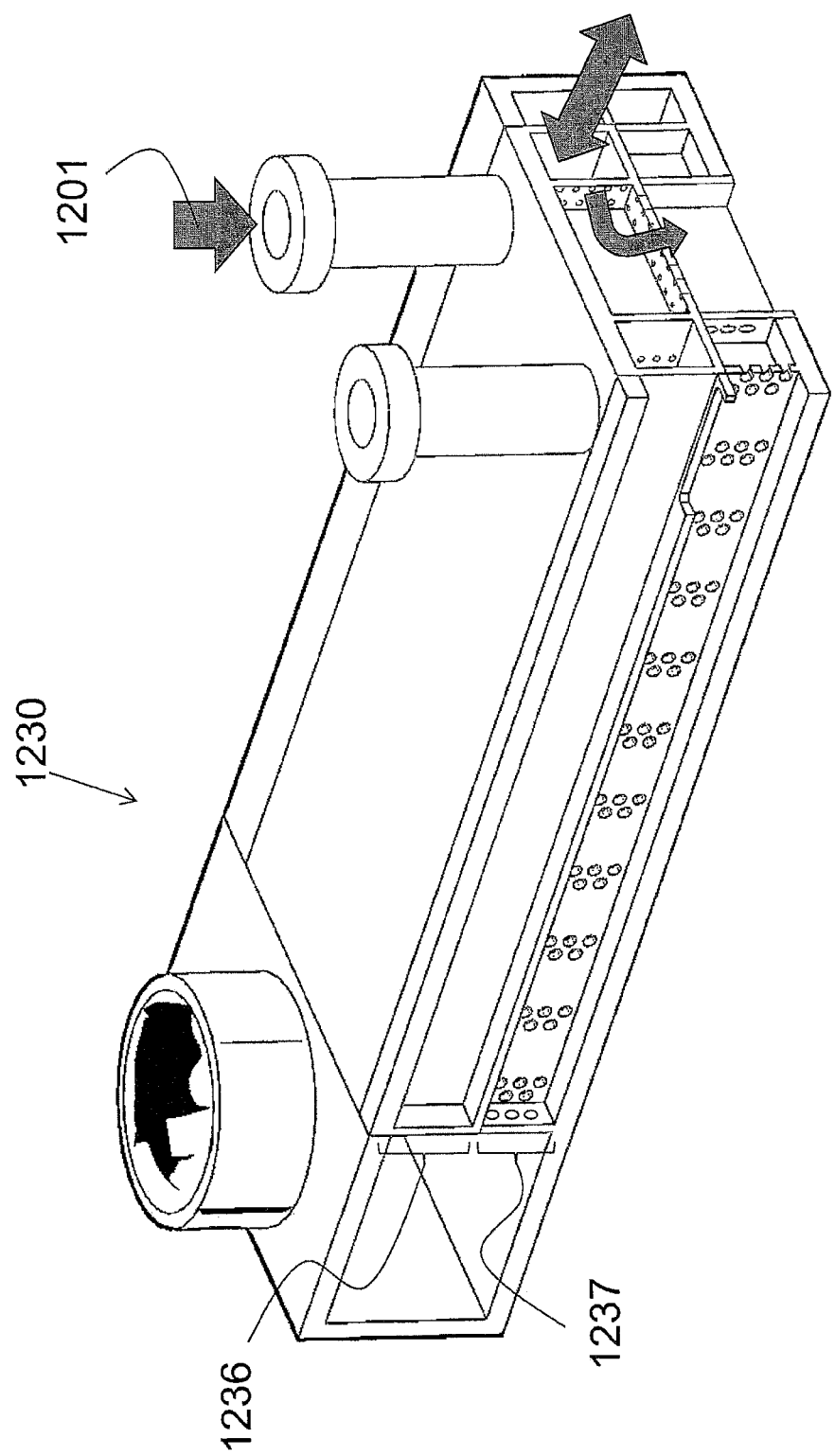
Figure 12C:
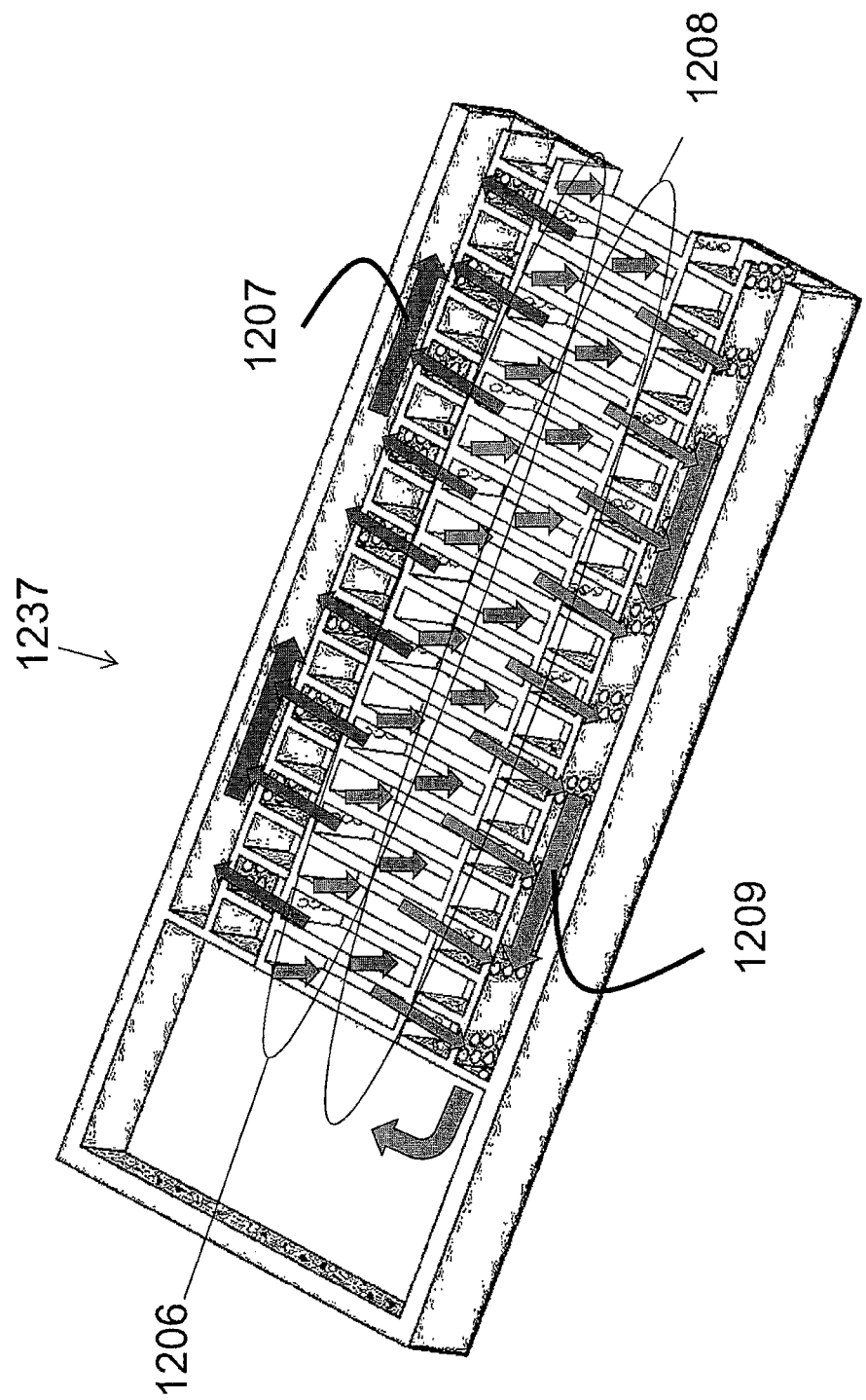
Figure 12D:
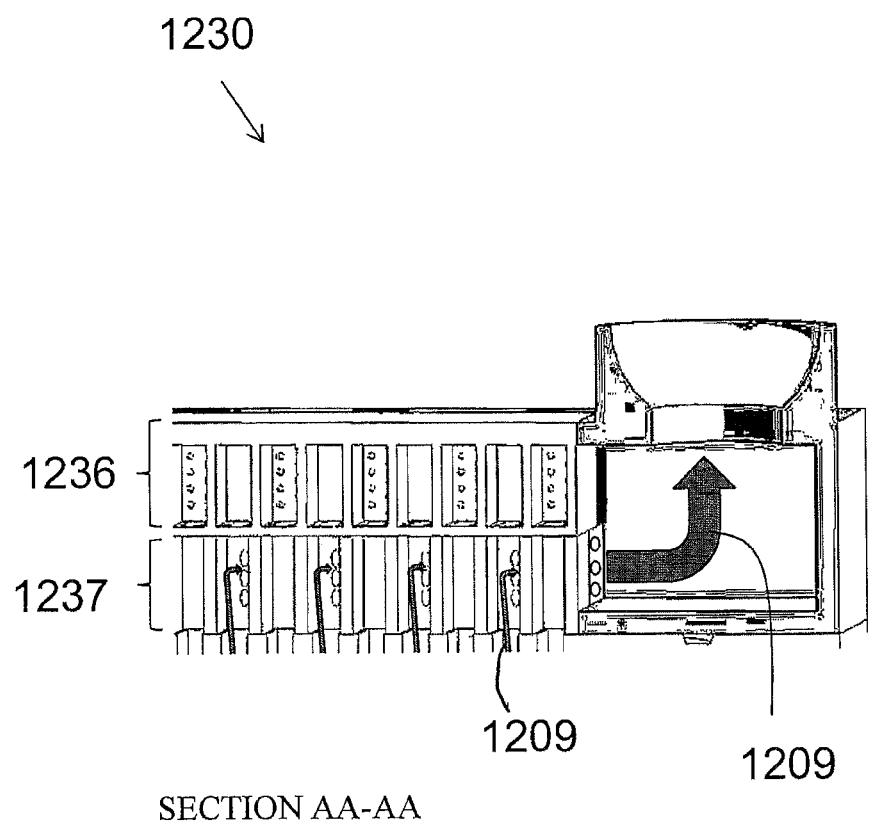

FIGS. 12A through 12D show views of an example of a gas manifold suitable for use with a substrate carrier such as shown in FIGS. 3A & 3B, which manifolds can accommodate the counterflow and also flow switching. Note that in embodiments the manifolds and substrate carrier may have greater depth to accommodate large substrates, such as substrates in the range of 140 to 170 mm on a side. FIG. 12A is a perspective view of both upper and lower manifolds, 1232 and 1234, respectively, attached to a substrate carrier 1210. The following gas flows are identified: process gas in (pass 1) 1201, process gas in (pass 2) 1202, exhaust gas out (pass 1) 1203, and exhaust gas out (pass 2) 1204. (Herein pass 1 and pass 2 refer to the first and second cycles, respectively, of the counterflow.) FIG. 12B is a perspective view of gas manifold 1230 with front and end cut-away showing a process gas tier 1236 for flowing process gas 1201 into the substrate carrier, and an exhaust gas tier 1237 for flowing exhaust gas out of the substrate carrier; the flow of process gas 1201 through one of the two process gas intakes and through the manifold is shown. FIG. 12C is a perspective view of the exhaust gas tier 1237 of the upper gas manifold, showing exhaust gas flows (exhaust gas flow (odd channels) $1^{st}$ pass 1207, exhaust gas flow (even channel) $2^{nd}$ pass 1209 after switching direction of flow), and the flows of process gases (process gas in (even channels) $1^{st}$ pass 1206, process gas in (odd channels) 2 pass 1208) from the process gas tier through the exhaust gas tier toward the substrate carrier. FIG. 12D is a perspective view of the end of the gas manifold 1230, cut along AA-AA, showing the flow of exhaust gas 1209 through the exhaust gas tier 1237 of the manifold and out of the manifold.

Figure 13:
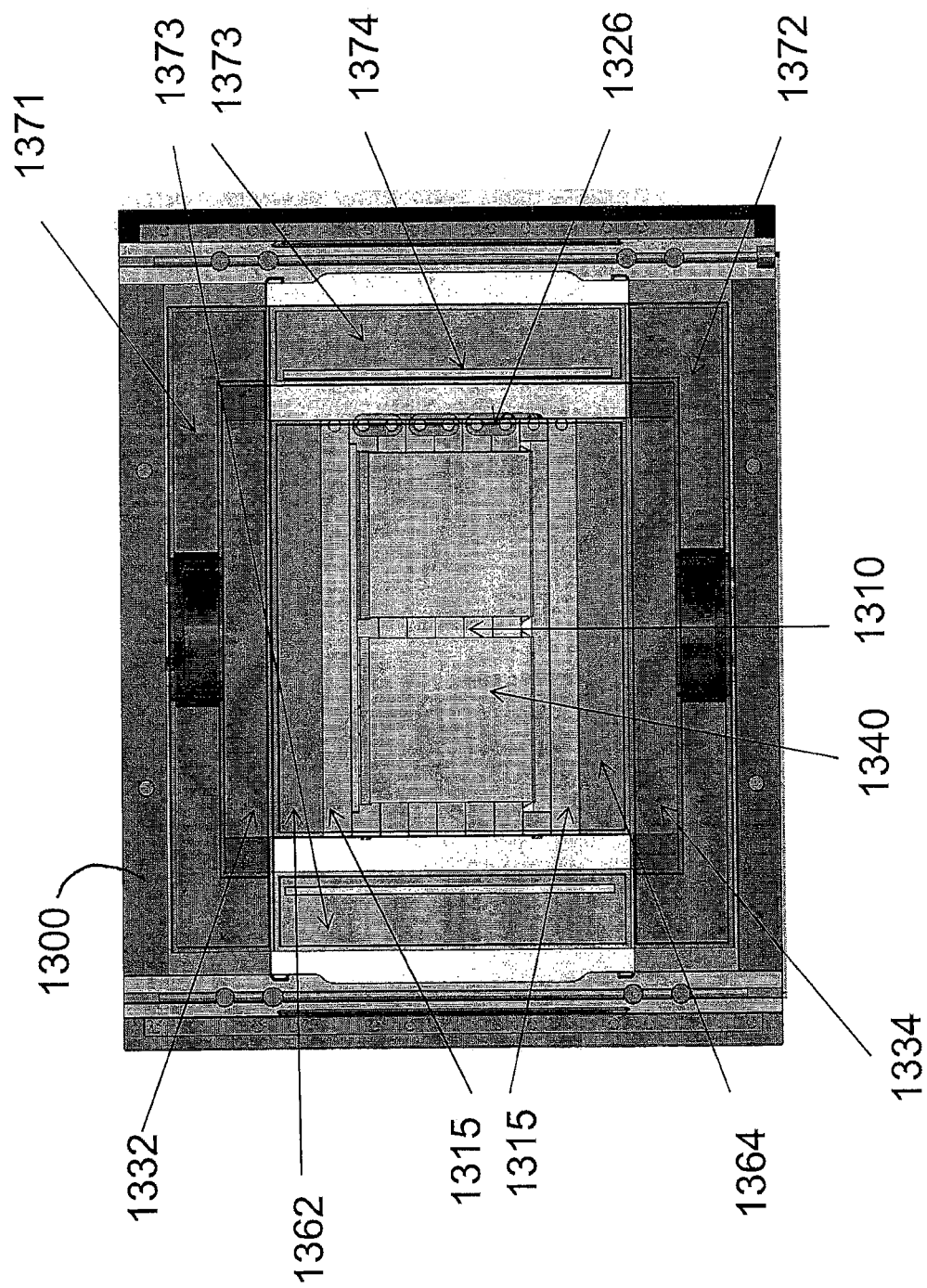
FIG. 13 shows a front view of a substrate carrier in a CVD reactor according to some embodiments of the present invention, according to some embodiments of the present invention.

FIG. 13 shows a front view of a substrate carrier in a CVD reactor according to some embodiments of the present invention, where thermally insulating blocks are attached to the chamber walls 1300 on the interior of the vacuum chamber. There are upper and lower insulators 1371 and 1372, respectively. Blocks 1373 may comprise quartz shells and be filled with other thermally insulating materials; furthermore, reflective coatings 1374 may be applied to the interior side of the quartz shell to improve reflection of heat. For completeness, substrates 1340, resistive heating elements 1310, pre-heaters 1315, series electrical connectors 1326, upper and lower runways 1362 and 1364, respectively, and upper and lower gas manifolds 1332 and 1334 are also shown. Note that pre-heaters 1315 may be utilized if extra heat needs to be added to the process gas before entering the channels in the substrate carrier where the substrates are mounted; the pre-heaters may be formed of the same resistive heating material as components 1310.

According to some embodiments, a method of operating a CVD reactor of the present invention as described above, may comprise: mounting silicon carbide substrates in the substrate carrier; loading the substrate carrier into the vacuum chamber and mating the substrate carrier with the upper gas manifold and the lower gas manifold; providing and maintaining a vacuum environment within the vacuum chamber; making electrical contact to the at least one electrically resistive heater, heating the substrates to a deposition temperature by flowing current through the at least one electrically resistive heater; and while heating the substrates, flowing process gas through odd numbered channels from the upper gas manifold to the lower gas manifold, and simultaneously flowing process gas through even numbered channels from the lower gas manifold to the upper gas manifold. Furthermore, during the flowing process gas, the direction of gas flow in said even and odd channels may be simultaneously switched to improve the uniformity of material being deposited on the substrates. Furthermore, the process gas may comprise a mixture of trichlorosilane (TCS), a source of carbon (such as ethylene or propane) and hydrogen when silicon carbide is being deposited on the substrates. Furthermore, in other embodiments the process gas may comprise dichlorosilane, and in further embodiments the process gas may be delivered at lower than atmospheric pressure (down to 300 Torr). The silicon carbide may be deposited in different forms, including 4H silicon carbide. Furthermore, process gas may be preheated in runways in the substrate carrier before reaching the substrates mounted in the channels by heat exchange from exhaust gases to process gases through the walls of the runways.

Although embodiments of the present disclosure have been particularly described with reference to certain embodiments thereof, it should be readily apparent to those of ordinary skill in the art that changes and modifications in the form and details may be made without departing from the spirit and scope of the disclosure.

What is claimed is:

1. A chemical vapor deposition (CVD) reactor for single sided deposition of silicon carbide material on silicon carbide substrates, comprising:
    a vacuum chamber;
    an upper gas manifold and a lower gas manifold within said vacuum chamber; and
    a substrate carrier comprising a gas tight rectangular box open on upper and lower surfaces, said gas tight box comprising a first multiplicity of planar walls across the width of said box, said walls being equally spaced about a center line in a row facing each other and defining a row of channels within said box, said walls comprising mounting fixtures for a plurality of substrates, said walls comprising at least one electrically resistive heater element;
    wherein said upper gas manifold and said lower gas manifold are configured to attach to said upper and lower surfaces of said substrate carrier, respectively, said upper gas manifold and said lower gas manifold connecting with upper and lower ends of said channels, said upper gas manifold and said lower gas manifold being configured to isolate gas flows in odd numbered channels from gas flows in even numbered channels, wherein said channels are numbered in order along said row, wherein said gas flows through said channels are from one of said upper gas manifold and said lower gas manifold to the other of said upper gas manifold and said lower gas manifold, wherein said upper gas manifold and said lower gas manifold are configured to allow gas flows in odd numbered channels to be in opposite directions to gas flows in even numbered channels, and wherein said electrically resistive heater elements and said mounting fixtures are coated with a material able to withstand exposure to (i) chemicals for removal of silicon carbide, the chemicals including $ClF_3$, and (ii) process temperatures up to 1700° C., wherein the material includes tantalum carbide, diamond and/or boron nitride.

2. The CVD reactor of claim 1, wherein said first multiplicity of planar walls are parallel.

3. The CVD reactor of claim 1, wherein each of said first multiplicity of planar walls comprises a single electrically resistive heater element.

4. The CVD reactor of claim 1, wherein each of said multiplicity of planar walls comprises a second multiplicity of electrically resistive heater elements, said second multiplicity of heater elements being arranged in parallel stripes roughly perpendicular to the direction of gas flow through said channels, from one of the upper or lower gas manifolds to the other.

5. The CVD reactor of claim 4, wherein said second multiplicity of heater elements are electrically connected together in series.

6. The CVD reactor of claim 4, wherein each of said second multiplicity of heater elements are configured to be independently controllable.

7. The CVD reactor of claim 4, wherein said first multiplicity of planar walls are parallel.

8. The CVD reactor of claim 4, wherein each of said second multiplicity of electrically resistive heater elements has a serpentine configuration.

9. The CVD reactor of claim 4, further comprising runways at the top and bottom of said channels.

10. The CVD reactor of claim 1, wherein said electrically resistive heater elements comprise tantalum carbide coated graphite elements.

11. The CVD reactor of claim 1, wherein said material is epitaxial single crystal silicon carbide and said substrates are single crystal silicon carbide.

12. The CVD reactor of claim 1, wherein said mounting fixtures include substrate holders configured to fit within said channels, said substrate holders being configured to allow gas flow over both surfaces of said substrates when mounted in said substrate holder.

13. The CVD reactor of claim 12, wherein said first multiplicity of planar walls are parallel.

14. The CVD reactor of claim 12, wherein each of said multiplicity of planar walls comprises a single electrically resistive heater element.

15. The CVD reactor of claim 12, wherein each of said multiplicity of planar walls comprises a second multiplicity of electrically resistive heater elements, said second multiplicity of heater elements being arranged in parallel stripes roughly perpendicular to the direction of gas flow through said channels from one of the upper or lower gas manifolds to the other.

16. The CVD reactor of claim 15, wherein said second multiplicity of heater elements are electrically connected together in series.

17. The CVD reactor of claim 15, wherein each of said second multiplicity of heater elements are configured to be independently controllable.

18. A CVD reactor for deposition of silicon carbide material on silicon carbide substrates, comprising:
   a vacuum chamber;
   an upper gas manifold and a lower gas manifold within said vacuum chamber; and
   a substrate carrier comprising:
      a gas tight rectangular box open on upper and lower surfaces, said gas tight box comprising a multiplicity of planar walls across the width of said box, said walls being equally spaced about a center line a row facing each other and defining a row of channels within said box, said walls comprising at least one electrically resistive heater element; and
      substrate holders configured to fit within said channels, said substrate holders being configured to allow gas flow over both surfaces of said substrates when mounted in said substrate holder; and
   wherein said upper gas manifold and said lower gas manifold are configured to attach to said upper and lower surfaces of said substrate carrier, respectively, said upper gas manifold and said lower gas manifold connecting with upper and lower ends of said channels, said upper gas manifold and said lower gas manifold being configured to isolate gas flows in odd numbered channels from gas flows in even numbered channels, wherein said channels are numbered in order along said row, wherein said gas flows through said channels are from one of said upper gas manifold and said lower gas manifold to the other of said upper gas manifold and said lower gas manifold, wherein said upper gas manifold and said lower gas manifold are configured to allow gas flows in odd numbered channels to be in opposite directions to gas flows in even numbered channels, and wherein said electrically resistive heater elements and said substrate holders are coated with a material able to withstand exposure to (i) chemicals for removal of silicon carbide, the chemicals including $ClF_3$, and (ii) process temperatures up to 1700° C., wherein the material includes tantalum carbide, diamond and boron nitride.

19. The CVD reactor of claim 18, wherein said first multiplicity of planar walls are parallel.

20. The CVD reactor of claim 18, wherein each of said multiplicity of planar walls comprises a single electrically resistive heater element.

21. The CVD reactor of claim 18, wherein each of said multiplicity of planar walls comprises a second multiplicity of electrically resistive heater elements, said second multiplicity of heater elements being arranged in parallel stripes roughly perpendicular to the direction of gas flow through said channels from one of the upper or lower gas manifolds to the other.

22. The CVD reactor of claim 21, wherein said second multiplicity of heater elements are electrically connected together in series.

23. The CVD reactor of claim 21, wherein each of said second multiplicity of heater elements are configured to be independently controllable.

* * * * *